US012756145B2

(12) United States Patent
Huang et al.

(10) Patent No.: US 12,756,145 B2
(45) Date of Patent: Oct. 6, 2026

(54) CONNECTOR ASSEMBLY WITH IMPROVED HEAT DISSIPATION EFFECT

(71) Applicant: DONGGUAN LUXSHARE TECHNOLOGIES CO., LTD, Dongguan City (CN)

(72) Inventors: Bin Huang, Dongguan City (CN); Qiongnan Chen, Dongguan City (CN); Hongji Chen, Dongguan City (CN); Chuanqi Gong, Dongguan City (CN)

(73) Assignee: DONGGUAN LUXSHARE TECHNOLOGIES CO., LTD, Dongguan City (CN)

( * ) Notice: Subject to any disclaimer, the term of this patent is extended or adjusted under 35 U.S.C. 154(b) by 279 days.

(21) Appl. No.: 18/229,222

(22) Filed: Aug. 2, 2023

(65) Prior Publication Data

US 2024/0250481 A1 Jul. 25, 2024

(30) Foreign Application Priority Data

Jan. 19, 2023 (CN) ......................... 202310088716.0

(51) Int. Cl.
*H01R 13/6594* (2011.01)
*G02B 6/42* (2006.01)
(Continued)

(52) U.S. Cl.
CPC ....... *H01R 13/6594* (2013.01); *G02B 6/4284* (2013.01); *H01R 12/57* (2013.01);
(Continued)

(58) Field of Classification Search
CPC .... H01R 13/6594; H01R 12/57; H01R 13/02; H01R 13/40; H01R 13/502; H01R 13/516;
(Continued)

(56) References Cited

U.S. PATENT DOCUMENTS

D464,631 S 10/2002 Billman
D468,269 S 1/2003 Hwang
(Continued)

FOREIGN PATENT DOCUMENTS

CN 201229997 Y 4/2009
CN 202076608 U 12/2011
(Continued)

OTHER PUBLICATIONS

U.S. Office Action for U.S. Appl. No. 29/886,157, dated May 27, 2025.
U.S. Office Action for U.S. Appl. No. 18/229,442, dated Dec. 31, 2025.
(Continued)

*Primary Examiner* — Justin M Kratt
(74) *Attorney, Agent, or Firm* — Birch, Stewart, Kolasch & Birch, LLP

(57) ABSTRACT

A connector assembly includes an electrical connector, a metal shielding cage, and a heat dissipation element. The electrical connector includes an insulating body and a number of conductive terminals configured to be mounted on a circuit board. The insulating body includes a mating slot. The metal shielding cage is shielded on a periphery of the electrical connector. The metal shielding cage includes a receiving chamber in communication with the mating slot. The receiving chamber and the mating slot are configured to receive a mating connector along a first direction. The first direction is perpendicular to the circuit board. The heat dissipation element is fixed to the metal shielding cage.

20 Claims, 31 Drawing Sheets

(51) Int. Cl.

| | |
|---|---|
| ***H01R 12/57*** | (2011.01) |
| ***H01R 13/02*** | (2006.01) |
| ***H01R 13/40*** | (2006.01) |
| ***H01R 13/502*** | (2006.01) |
| ***H01R 13/516*** | (2006.01) |
| ***H01R 13/6587*** | (2011.01) |
| ***H05K 7/20*** | (2006.01) |
| *H01R 12/58* | (2011.01) |
| *H01R 12/71* | (2011.01) |
| *H01R 13/405* | (2006.01) |
| *H01R 13/648* | (2006.01) |
| *H01R 13/658* | (2011.01) |
| *H01R 13/6582* | (2011.01) |
| *H01R 13/6583* | (2011.01) |
| *H01R 13/6586* | (2011.01) |
| *H01R 13/6591* | (2011.01) |

(52) U.S. Cl.

CPC ............. *H01R 13/02* (2013.01); *H01R 13/40* (2013.01); *H01R 13/502* (2013.01); *H01R 13/516* (2013.01); *H01R 13/6587* (2013.01); *H05K 7/2039* (2013.01); *H05K 7/20409* (2013.01); *H05K 7/20418* (2013.01); *H01R 12/58* (2013.01); *H01R 12/716* (2013.01); *H01R 13/405* (2013.01); *H01R 13/648* (2013.01); *H01R 13/658* (2013.01); *H01R 13/6582* (2013.01); *H01R 13/6583* (2013.01); *H01R 13/6586* (2013.01); *H01R 13/6591* (2013.01); *Y02T 10/70* (2013.01)

(58) Field of Classification Search

CPC .. H01R 13/6587; H01R 12/58; H01R 12/716; H01R 13/405; H01R 13/648; H01R 13/658; H01R 13/6582; H01R 13/6583; H01R 13/6586; H01R 13/6591; G02B 6/4284; H05K 7/2039; H05K 7/20409; H05K 7/20418; Y02T 10/70

See application file for complete search history.

(56) References Cited

U.S. PATENT DOCUMENTS

| | | | | |
|---|---|---|---|---|
| D468,270 | S | 1/2003 | Hwang | |
| D468,698 | S | 1/2003 | Hwang | |
| D569,807 | S | 5/2008 | Zheng et al. | |
| 7,497,733 | B1 | 3/2009 | Van der Steen | |
| 8,599,559 | B1 | 12/2013 | Morrison et al. | |
| 8,830,679 | B2 | 9/2014 | Scholeno | |
| 9,124,025 | B2 | 9/2015 | Xue et al. | |
| 9,893,472 | B1 | 2/2018 | Chen | |
| 10,476,198 | B1 | 11/2019 | Pogash et al. | |
| 10,551,580 | B2 | 2/2020 | Regnier et al. | |
| 10,588,243 | B2 | 3/2020 | Little et al. | |
| 11,165,185 | B2 | 11/2021 | Lloyd et al. | |
| 11,177,592 | B2 | 11/2021 | Scholeno et al. | |
| 11,205,873 | B2 | 12/2021 | Liu et al. | |
| 11,431,130 | B2 | 8/2022 | Yang | |
| 12,199,383 | B2 | 1/2025 | Little et al. | |
| D1,073,616 | S | 5/2025 | Guo et al. | |
| D1,119,817 | S | 3/2026 | Huang et al. | |
| D1,131,415 | S | 6/2026 | Huang et al. | |
| D1,131,416 | S | 6/2026 | Huang et al. | |
| 2002/0141706 | A1 | 10/2002 | Nakura et al. | |
| 2009/0098767 | A1 | 4/2009 | Long | |
| 2009/0114439 | A1 | 5/2009 | Su et al. | |
| 2009/0305555 | A1 | 12/2009 | Wang et al. | |
| 2012/0225593 | A1 | 9/2012 | Akuta | |
| 2013/0077254 | A1 | 3/2013 | Nguyen | |
| 2013/0089997 | A1 | 4/2013 | Orris et al. | |
| 2013/0164970 | A1 | 6/2013 | Regnier et al. | |
| 2013/0186681 | A1 | 7/2013 | Wickes et al. | |
| 2015/0029667 | A1 | 1/2015 | Szczesny | |
| 2015/0171558 | A1 | 6/2015 | Yu et al. | |
| 2016/0233615 | A1 | 8/2016 | Scholeno | |
| 2017/0324176 | A1* | 11/2017 | Ishikawa ............ | H01R 13/6596 |
| 2018/0337476 | A1 | 11/2018 | Guy Ritter et al. | |
| 2019/0181582 | A1 | 6/2019 | Beltran et al. | |
| 2019/0320552 | A1 | 10/2019 | Hsu | |
| 2020/0049912 | A1 | 2/2020 | Lu | |
| 2020/0233162 | A1 | 7/2020 | Yu | |
| 2020/0328541 | A1 | 10/2020 | Lai et al. | |
| 2021/0022268 | A1* | 1/2021 | Sharf ...................... | F28F 3/025 |
| 2021/0175667 | A1 | 6/2021 | Wei et al. | |
| 2022/0006217 | A1 | 1/2022 | Huang et al. | |
| 2022/0013960 | A1 | 1/2022 | Guetig et al. | |
| 2022/0052492 | A1 | 2/2022 | Guo et al. | |
| 2022/0102906 | A1 | 3/2022 | Huang et al. | |
| 2022/0190506 | A1 | 6/2022 | Yang | |
| 2022/0244472 | A1 | 8/2022 | Goergen et al. | |
| 2022/0287205 | A1 | 9/2022 | Huang et al. | |
| 2022/0384970 | A1 | 12/2022 | Huang et al. | |
| 2023/0059336 | A1 | 2/2023 | Yen et al. | |
| 2023/0246396 | A1* | 8/2023 | Kao .................. | H01R 13/6583 439/676 |
| 2023/0396020 | A1 | 12/2023 | Little | |
| 2024/0047925 | A1 | 2/2024 | Duan et al. | |
| 2024/0136773 | A1 | 4/2024 | Duan et al. | |
| 2025/0004224 | A1 | 1/2025 | Huang et al. | |

FOREIGN PATENT DOCUMENTS

| | | | |
|---|---|---|---|
| CN | 203218595 | U | 9/2013 |
| CN | 203631842 | U | 6/2014 |
| CN | 203859322 | U | 10/2014 |
| CN | 105449401 | A | 3/2016 |
| CN | 208157718 | U | 11/2018 |
| CN | 109755796 | A | 5/2019 |
| CN | 111682366 | A | 9/2020 |
| CN | 111864477 | A | 10/2020 |
| CN | 111883962 | A | 11/2020 |
| CN | 112117582 | A | 12/2020 |
| CN | 212485697 | U | 2/2021 |
| CN | 112993659 | A | 6/2021 |
| CN | 113193436 | A | 7/2021 |
| CN | 113437556 | A | 9/2021 |
| CN | 113823958 | A | 12/2021 |
| CN | 111755916 | B | 2/2022 |
| CN | 216720366 | U | 6/2022 |
| CN | 217158753 | U | 8/2022 |
| CN | 217693948 | U | 10/2022 |
| CN | 115275716 | A | 11/2022 |
| CN | 116598823 | A | 8/2023 |
| CN | 117276979 | A | 12/2023 |
| KR | 10-2020-0133569 | A | 11/2020 |
| KR | 10-2021-0012517 | A | 2/2021 |
| TW | 130795 | B | 9/2009 |
| TW | M514674 | U | 12/2015 |
| TW | 201803229 | A | 1/2018 |
| TW | M563683 | U | 7/2018 |
| TW | M569093 | U | 10/2018 |
| TW | 202203522 | A | 1/2022 |
| TW | M628977 | U | 7/2022 |
| WO | WO 2014/154579 | A1 | 10/2014 |
| WO | WO 2015/181625 | A2 | 12/2015 |

OTHER PUBLICATIONS

@donggaunfuyconnelectronics2183, "SFP Connector single layer double layer SFP Cage, SFP+ Connector w/SFP+ Cage," YouTube [Online], https://www.youtube/com/shorts/2fVVWxcUzww, Aug. 25, 2023, 2 pages total.

TE Connectivity, "SFP Cage, 1 Port, Through Hole, Pluggable I/O Connectors & Cages Connectors (2227303-3) Pack of 1," Amazon [Online], https://www.amazon.co.uk/dp/B071DR1M3D, Jan. 10, 2024, 1 page total.

U.S. Notice of Allowance for U.S. Appl. No. 29/987,099, dated Feb. 24, 2026.

(56) References Cited

OTHER PUBLICATIONS

U.S. Office Action for U.S. Appl. No. 29/987,097, dated Aug. 25, 2026.

* cited by examiner

CONNECTOR ASSEMBLY WITH IMPROVED HEAT DISSIPATION EFFECT

CROSS-REFERENCE TO RELATED APPLICATION

This patent application claims priority of a Chinese Patent Application No. 202310088716.0, filed on Jan. 19, 2023 and titled "CONNECTOR ASSEMBLY", the entire content of which is incorporated herein by reference.

TECHNICAL FIELD

The present disclosure relates to a connector assembly, which belongs to a technical field of connectors.

BACKGROUND

A connector assembly in the related art generally includes a circuit board and a connector sub-assembly mounted to the circuit board. The connector sub-assembly includes an electrical connector and a metal shielding cage surrounding a periphery of the electrical connector for shielding. The metal shielding cage is provided with a receiving chamber configured to receive a mating connector. An extending direction of the receiving chamber is parallel to the circuit board.

In addition, how to improve the heat dissipation effect is also a technical problem faced by those skilled in the art.

SUMMARY

An object of the present disclosure is to provide a connector assembly with better heat dissipation effect.

In order to achieve the above object, the present disclosure adopts the following technical solution: a connector assembly, including: an electrical connector including an insulating body and a plurality of conductive terminals, the insulating body including a mating slot configured to receive a mating connector, the plurality of conductive terminals being configured to be mounted to a circuit board; a metal shielding cage shielding a periphery of the electrical connector, the metal shielding cage including a receiving chamber communicating with the mating slot, the receiving chamber and the mating slot being configured to jointly receive the mating connector along a first direction, the first direction being perpendicular to the circuit board; and a heat dissipation element mounted to the metal shielding cage.

In order to achieve the above object, the present disclosure adopts the following technical solution: a connector assembly, including: an electrical connector including an insulating body and a plurality of conductive terminals; the insulating body including a first mating slot and a second mating slot; the plurality of conductive terminals being configured to be mounted to a circuit board; a metal shielding cage shielding a periphery of the electrical connector; the metal shielding cage including a first end wall, a first side wall, a second side wall opposite to the first side wall, a second end wall opposite to the first end wall, and an inner metal shell; the first end wall, the first side wall, the second side wall and the second end wall being jointly enclosed to form a receiving chamber; the inner metal shell divides the receiving chamber into a first receiving chamber and a second receiving chamber located on two sides of the inner metal shell, respectively; the first receiving chamber and the first mating slot being in communication and configured to receive a first mating connector along a first direction; the second receiving chamber and the second mating slot being in communication and configured to accommodate a second mating connector along the first direction; and a heat dissipation element including a mounting block mounted in the inner metal shell, the mounting block being a metal block.

Compared with the prior art, the receiving chamber of the metal shielding cage in the present disclosure extends along the first direction perpendicular to the circuit board, thereby reducing an area occupied by the metal shielding cage on the circuit board. Besides, the present disclosure is provided with the heat dissipation element mounted to the metal shielding cage, thereby improving the heat dissipation effect.

DETAILED DESCRIPTION

Figure 1:
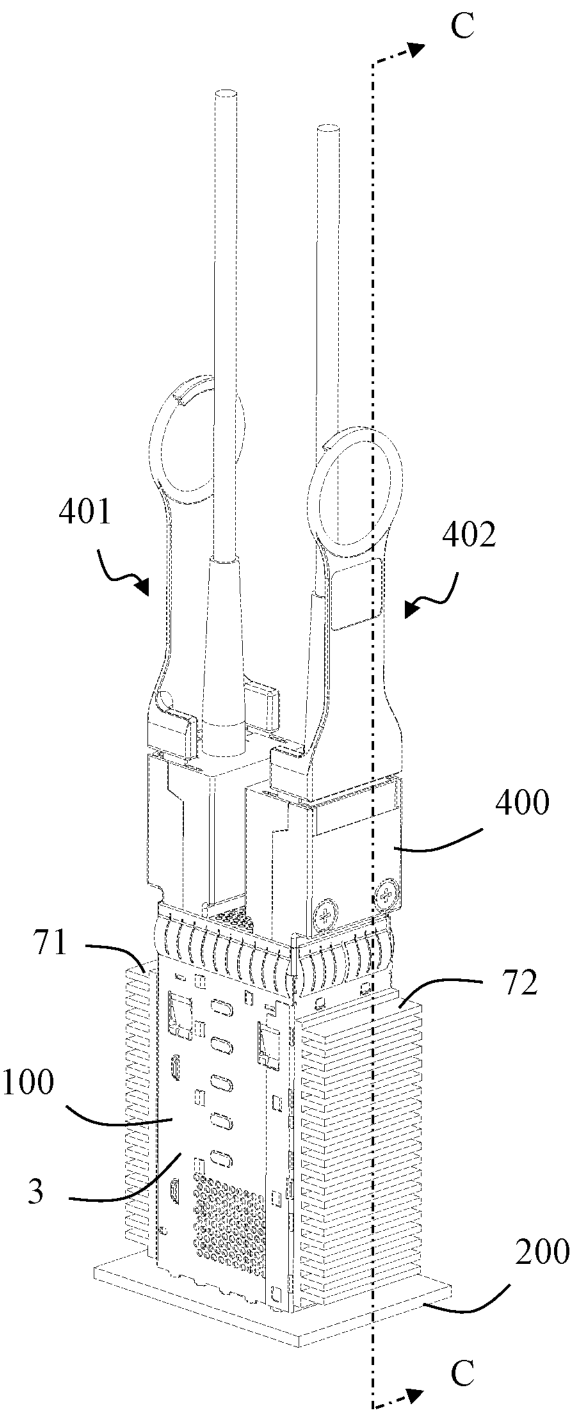
FIG. 1 is a schematic perspective view of a connector assembly in accordance with a first embodiment of the present disclosure.

Exemplary embodiments will be described in detail here, examples of which are shown in drawings. When referring to the drawings below, unless otherwise indicated, same numerals in different drawings represent the same or similar elements. The examples described in the following exemplary embodiments do not represent all embodiments consistent with this application. Rather, they are merely examples of devices and methods consistent with some aspects of the application as detailed in the appended claims.

The terminology used in this application is only for the purpose of describing particular embodiments, and is not intended to limit this application. The singular forms "a", "said", and "the" used in this application and the appended claims are also intended to include plural forms unless the context clearly indicates other meanings.

It should be understood that the terms "first", "second" and similar words used in the specification and claims of this application do not represent any order, quantity or importance, but are only used to distinguish different components. Similarly, "an" or "a" and other similar words do not mean a quantity limit, but mean that there is at least one; "multiple" or "a plurality of" means two or more than two. Unless otherwise noted, "front", "rear", "lower" and/or "upper" and similar words are for ease of description only and are not limited to one location or one spatial orientation. Similar words such as "include" or "comprise" mean that elements or objects appear before "include" or "comprise" cover elements or objects listed after "include" or "comprise" and their equivalents, and do not exclude other elements or objects. The term "a plurality of" mentioned in the present disclosure includes two or more.

Hereinafter, some embodiments of the present disclosure will be described in detail with reference to the accompanying drawings. In the case of no conflict, the following embodiments and features in the embodiments can be combined with each other.

Referring to FIG. 1 to FIG. 19, the present disclosure discloses a connector assembly, which includes a circuit board 200, a connector sub-assembly 100 mounted to the circuit board 200, and a fastener 300 fastening the connector sub-assembly 100 on the circuit board 200. The connector sub-assembly 100 includes an electrical connector 10 and a metal shielding cage 20 shielding a periphery of the electrical connector 10. It is understandable to those skilled in the art that in the illustrated embodiment of the present disclosure, the metal shielding cage 20 and the electrical connector 10 are mounted to the circuit board 200, respectively. That is, there is no direct fixed relationship between the metal shielding cage 20 and the electrical connector 10. The metal shielding cage 20 is provided with a receiving chamber 30. The receiving chamber 30 is configured to accommodate the mating connector 400 along a first direction A1-A1 (for example, a top-bottom direction). The first direction A1-A1 is perpendicular to the circuit board 200.

In the illustrated embodiment of the present disclosure, the connector sub-assembly 100 has two ports. Correspondingly, the mating connector 400 includes a first mating connector 401 and a second mating connector 402.

Figure 2:
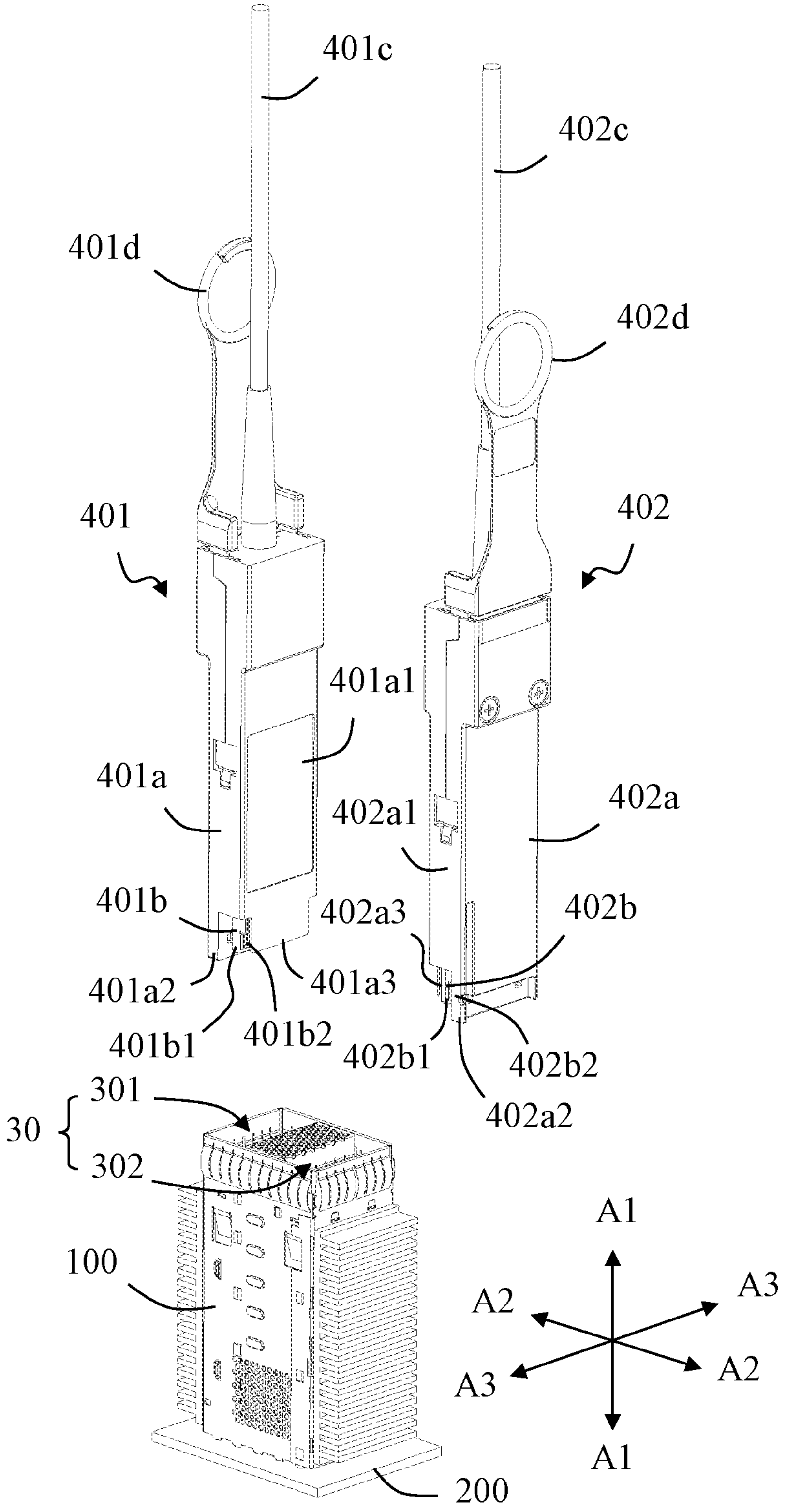
FIG. 2 is a partial perspective exploded view of FIG. 1, wherein the first mating connector and a second mating connector are separated.
Figure 3:
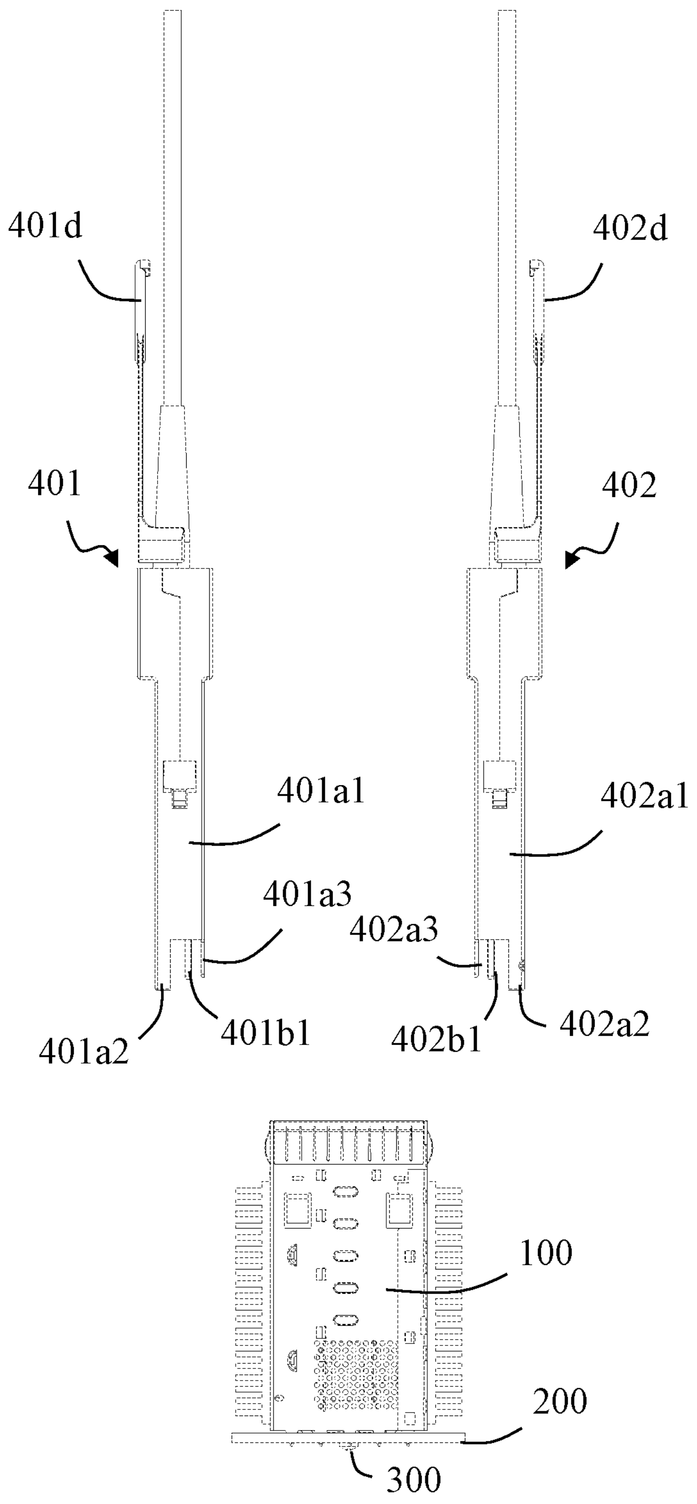
FIG. 3 is a front view of FIG. 2.

Referring to FIG. 2 and FIG. 3, the first mating connector 401 includes a first metal shell **401*a*, a first sub-circuit board 401*b* fixed in the first metal shell 401*a*, a first cable 401*c* electrically connected to the first sub-circuit board 401*b*, and a first unlocking ring 401*d*. The first metal shell 401*a* includes a first main body portion 401*a*1, a first extending tab 401*a*2 extending from the first main body portion 401*a*1, and a first positioning tab 401*a*3 extending from the first main body portion 401*a*1. In the illustrated embodiment of the present disclosure, the first extending tab 401*a*2 and the first positioning tab 401*a*3 are located at a same end of the first mating connector 401. The first extending tab 401*a*2 is substantially parallel to the first positioning tab 401*a*3. The first sub-circuit board 401*b* includes a first tongue 401*b*1 located between the first extending tab 401*a*2 and the first positioning tab 401*a*3. Two opposite surfaces of the first tongue plate 401*b* 1 are provided with a plurality of first metal pads 401*b*2. The widths of the first positioning tab 401*a*3 and the first extending tab 401*a*2 are different, so as to prevent mis-insertion. In the illustrated embodiment of the present disclosure, the thicknesses of the first positioning tab 401*a*3 and the first extending tab 401*a*2** are also different, so as to prevent mis-insertion.

The second mating connector 402 includes a second metal shell **402*a*, a second sub-circuit board 402*b* fixed in the second metal shell 402*a*, a second cable 402*c* electrically connected to the second sub-circuit board 402*b*, and a second unlocking ring 402*d*. The second metal shell 402*a* includes a second main body portion 402*a*1, a second extending tab 402*a*2 extending from the second main body portion 402*a*1, and a second positioning tab 402*a*3 extending from the second main body portion 402*a*1. In the illustrated embodiment of the present disclosure, the second extending tab 402*a*2 and the second positioning tab 402*a*3 are located at a same end of the second mating connector 402. The second extending tab 402*a*2 is substantially parallel to the second positioning tab 402*a*3. The second sub-circuit board 402*b* includes a second tongue 402*b* 1 located between the second extending tab 402*a*2 and the second positioning tab 402*a*3. Two opposite surfaces of the second tongue plate 402*b*1 are provided with a plurality of second metal pads 402*b*2. The widths of the second positioning tab 402*a*3 and the second extending tab 402*a*2 are different, so as to prevent mis-insertion. In the illustrated embodiment of the present disclosure, the thicknesses of the second positioning tab 402*a*3 and the second extending tab 402*a*2** are also different, so as to prevent mis-insertion.

In the illustrated embodiment of the present disclosure, the first mating connector 401 and the second mating connector 402 are the same connector, such as an SFP (Small Form Pluggable) plug connector. However, in the illustrated embodiment of the present disclosure, the first mating connector 401 and the second mating connector 402 are arranged belly to belly. That is, the first mating connector 401 rotates 180 degrees relative to the second mating connector 402 in a horizontal plane. The first unlocking ring **401*d* is opposite to the second unlocking ring 402*d*. That is, the first unlocking ring 401*d* and the second unlocking ring 402*d* can be disposed as far away from each other as possible. This arrangement enables both the first unlocking ring 401***d* and the second unlocking ring 402*d* to be located on the outside of corresponding mating connector, so as to prevent mutual interference between the first unlocking ring 401*d* and the second unlocking ring 402*d*.

Figure 4:
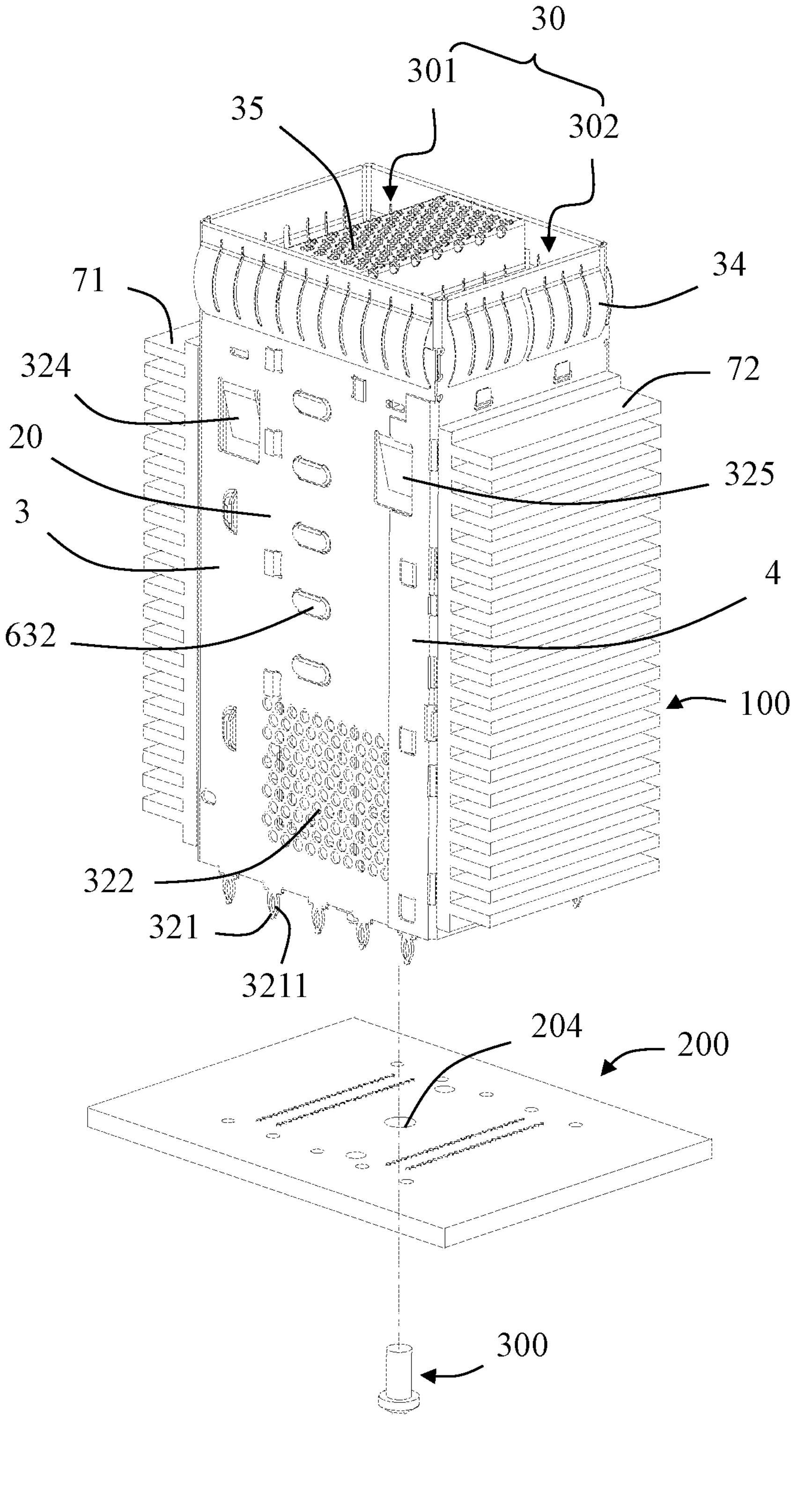
FIG. 4 is an exploded perspective view of the connector assembly, a fastener and a circuit board in FIG. 1 of the present disclosure.
Figure 5:
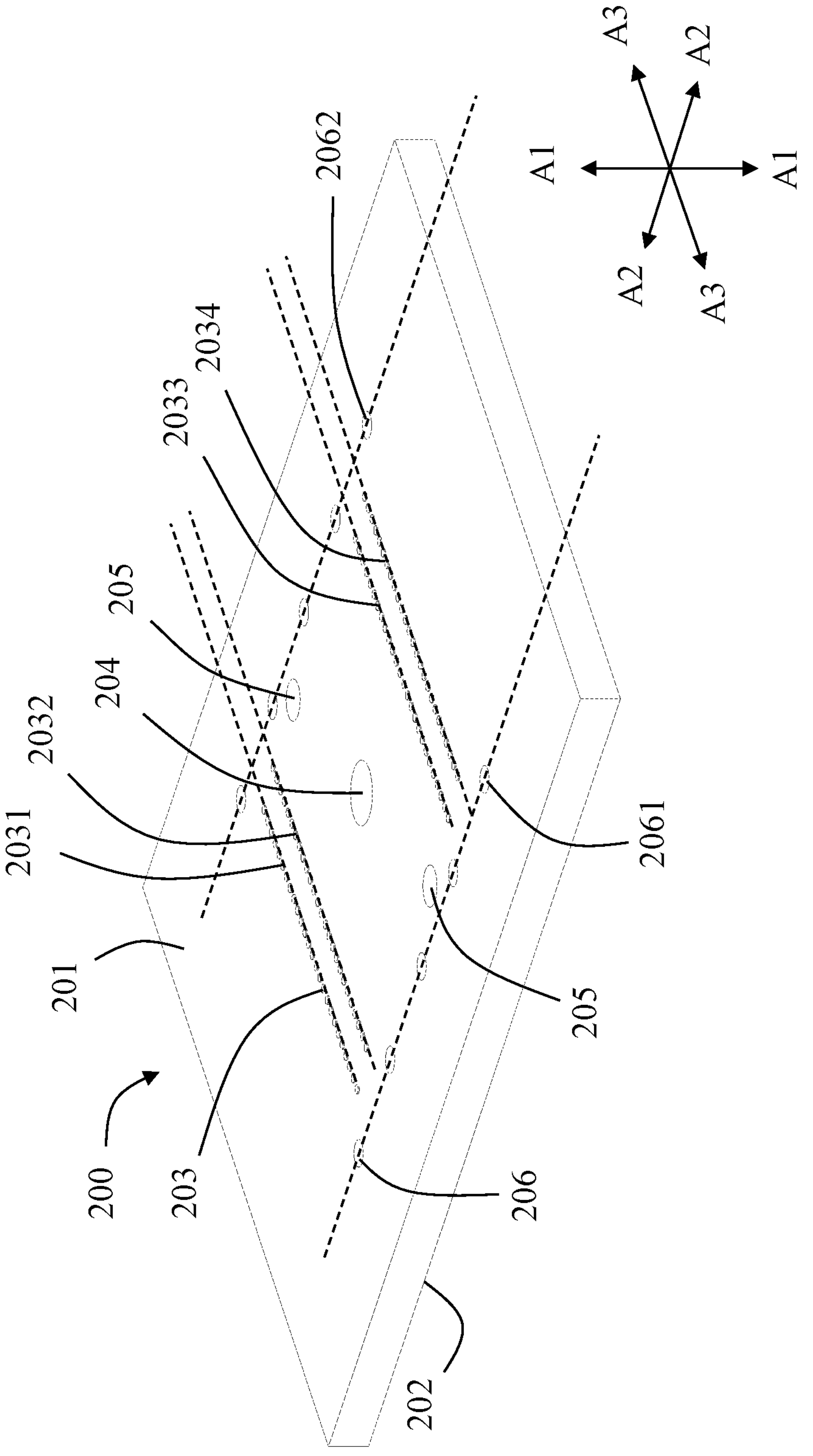
FIG. 5 is a perspective schematic view of the circuit board shown in FIG. 4.
Figure 6:
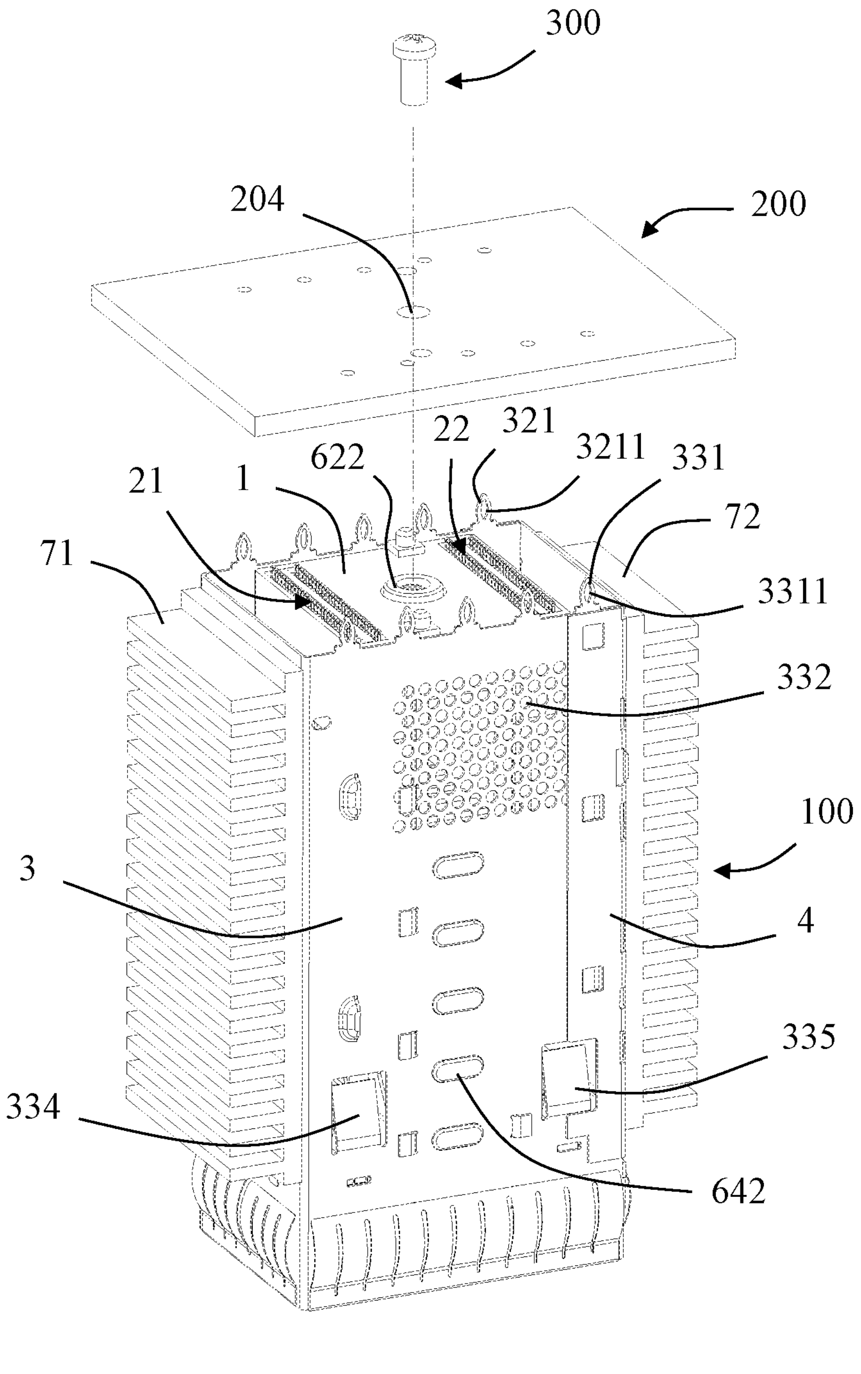
FIG. 6 is a perspective exploded view of FIG. 4 from another angle.

Referring to FIG. 4 to FIG. 6, the circuit board 200 includes a first surface 201 (for example, an upper surface), a second surface 202 (for example, a lower surface) opposite to the first surface 201, a plurality of conductive pads 203 exposed on the first surface 201, a mounting through hole 204 extending through the first surface 201 and the second surface 202, a plurality of positioning holes 205 extending through the first surface 201 and the second surface 202, and a plurality of fastening holes 206 extending through the first surface 201 and the second surface 202. In one embodiment of the present disclosure, the circuit board 200 is a main circuit board on which a chip (not shown) and a plurality of electronic components (not shown) are disposed.

In the illustrated embodiment shown in the present disclosure, the plurality of conductive pads 203 include a first row of conductive pads 2031, a second row of conductive pads 2032, a third row of conductive pads 2033 and a fourth row of conductive pads 2034. The first row of conductive pads 2031, the second row of conductive pads 2032, the third row of conductive pads 2033 and the fourth row of conductive pads 2034 are parallel to each other.

The mounting through hole 204 and the plurality of positioning holes 205 are located between the second row of conductive pads 2032 and the third row of conductive pads 2033 along the second direction A2-A2. The plurality of fastening holes 206 include a first row of fastening holes 2061 and a second row of fastening holes 2062. The first row of fastening holes 2061 and the second row of fastening holes 2062 are parallel to each other, and are located on two sides of the plurality of conductive pads 203, respectively, along a third direction A3-A3 (for example, a left-right direction). In the illustrated embodiment of the present disclosure, the first direction A1-A1, the second direction A2-A2 and the third direction A3-A3 are perpendicular to one another.

Referring to FIG. 7, FIG. 8 and FIG. 11 to FIG. 16, in the illustrated embodiment of the present disclosure, the electrical connector 10 includes an insulating body 1 and a plurality of conductive terminals 2. The insulating body 1 includes a mounting surface 11 configured to be mounted on the circuit board 200 and a mating slot 12 opposite to the mounting surface 11. The insulating body 1 further includes a plurality of positioning posts 111 protruding downwardly beyond the mounting surface 11. The positioning posts 111 are configured to be inserted into corresponding positioning holes 205 to achieve positioning.

Figure 13:
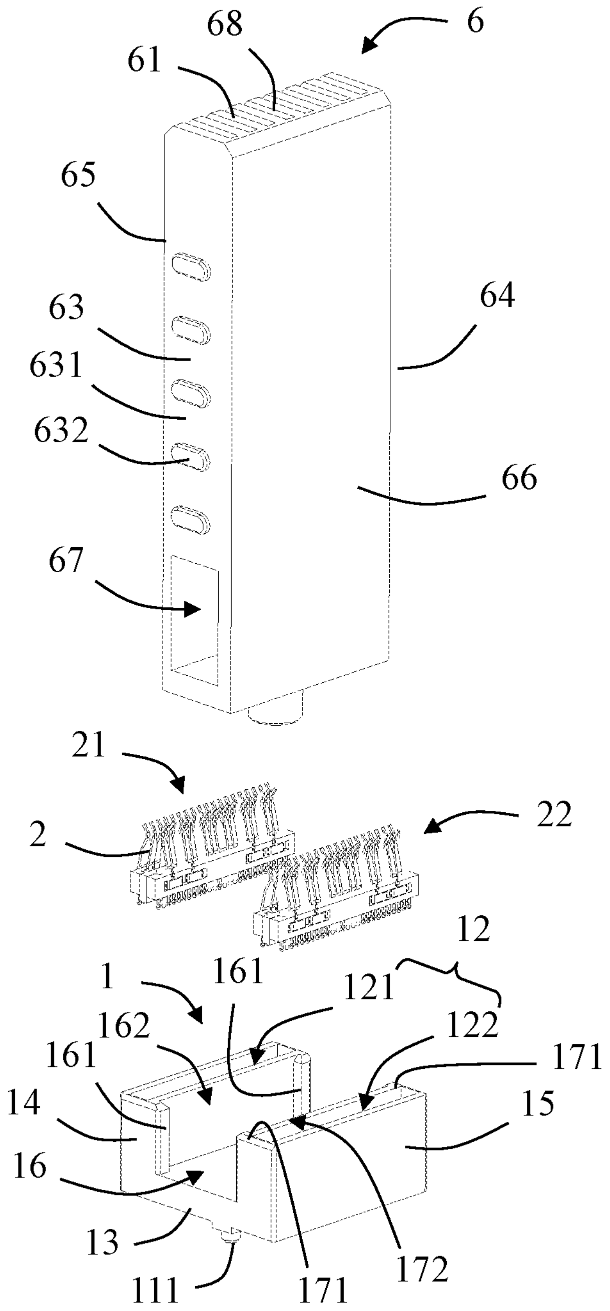
FIG. 13 is a perspective exploded view of an insulating body, a first terminal module, a second terminal module and the mounting block in FIG. 12.
Figure 14:
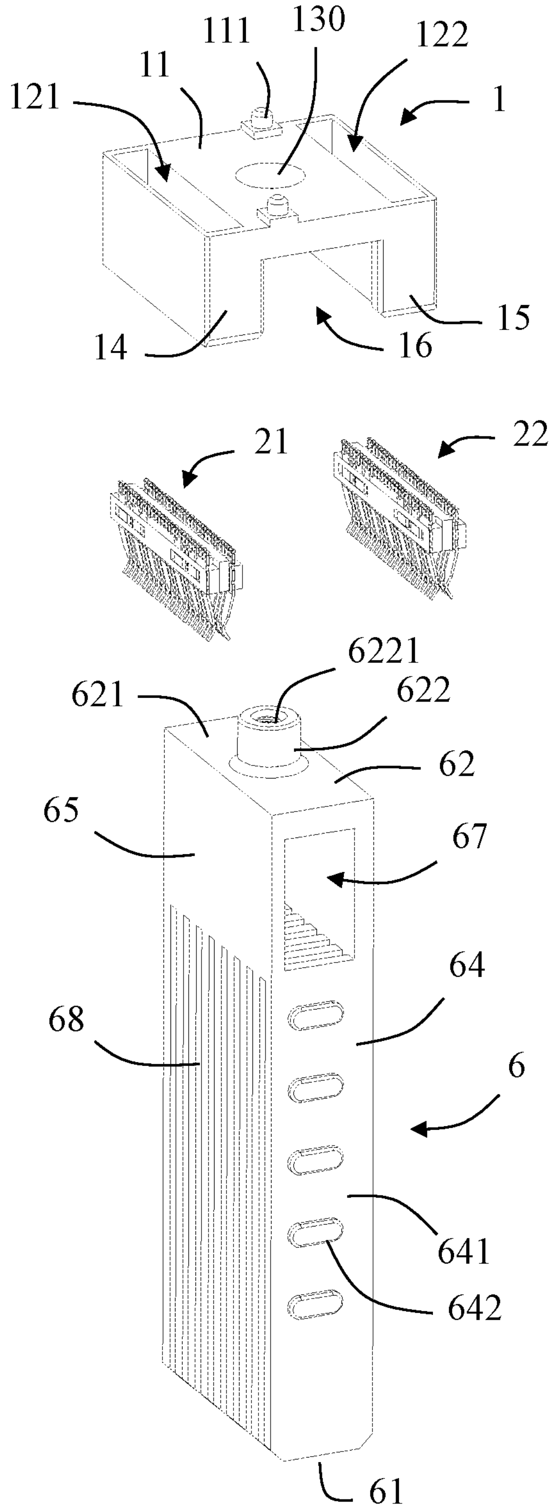
FIG. 14 is a perspective exploded view of FIG. 13 from another angle.

Referring to FIG. 13, in the embodiment illustrated in the present disclosure, the insulating body 1 includes a base portion 13, a first extension protrusion 14 extending from one side of the base portion 13 perpendicular to the base portion 13, and a second extension protrusion 15 extending from another side of the base portion 13 perpendicular to the base portion 13. The first extension protrusion 14 and the second extension protrusion 15 are located on a same side of the base portion 13, and are parallel to each other. The insulating body 1 further includes two first protrusions 161 protruding from two ends of the first extension protrusion 14 toward the second extension protrusion 15, and a first positioning slot 162 jointly formed by the first extension protrusion 14 and the two first protrusions 161. Similarly, the insulating body 1 further includes two second protrusions 171 protruding from two ends of the second extension protrusion 15 toward the first extension protrusion 14, and a second positioning slot 172 jointly formed by the second extension protrusion 15 and the two second protrusions 171. The insulating body 1 further includes a receiving groove 16 located between the first extension protrusion 14 and the second extension protrusion 15. Specifically, the receiving groove 16 is located between the first positioning slot 162 and the second positioning slot 172. The receiving groove 16 is in communication with the first positioning slot 162 and the second positioning slot 172. As shown in FIG. 6 and FIG. 14, the base portion 13 is provided with a through hole 130 extending along the first direction A1-A1 and communicating with the receiving groove 16. The through hole 130 is aligned with the mounting through hole 204 of the circuit board 200 along the first direction A1-A1.

Referring to FIG. 13, in the embodiment shown in the present disclosure, the mating slot 12 includes a first mating slot 121 formed on the first extension protrusion 14 and extending through the first extension protrusion 14 along the first direction A1-A1, and a second mating socket 122 formed on the second extension protrusion 15 and extending through the second extension protrusion 15 along the first direction A1-A1.

Figure 15:
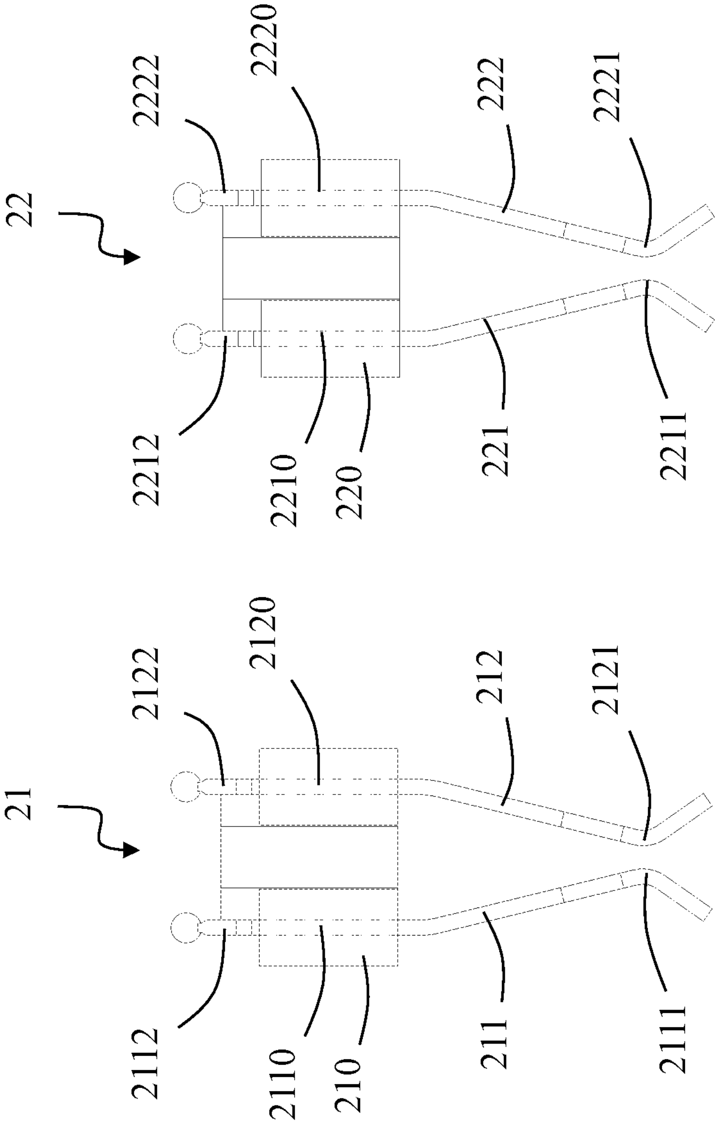
FIG. 15 is a front view of the first terminal module and the second terminal module in FIG. 14.
Figure 16:
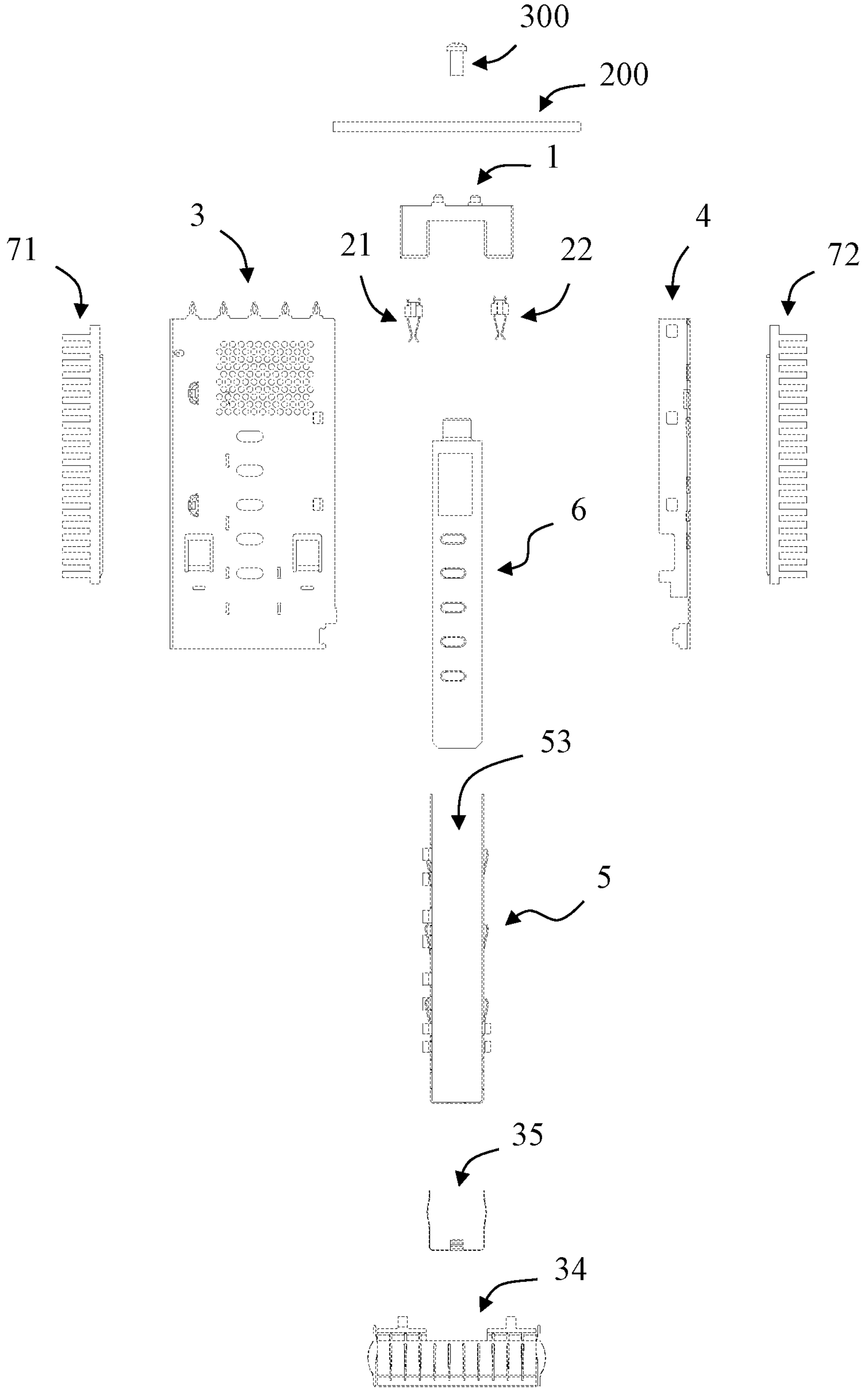
FIG. 16 is an exploded front view of the connector assembly in FIG. 1.
Figure 17:
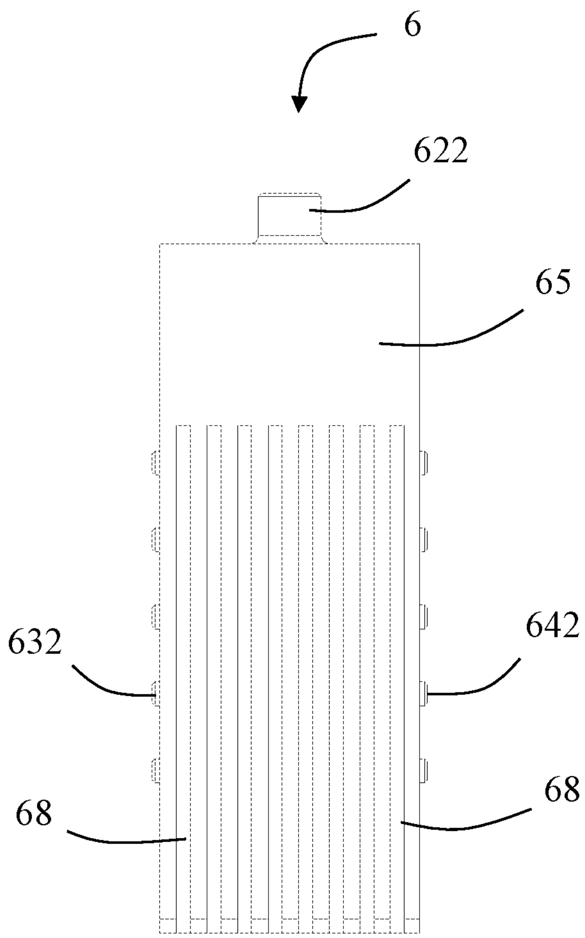
FIG. 17 is a left side view of the mounting block shown in FIG. 16.

Referring to FIG. 13 to FIG. 15, in the illustrated embodiment of the present disclosure, the electrical connector 10 includes a first terminal module 21 and a second terminal module 22 which are assembled to the insulating body 1.

Referring to FIG. 15, the first terminal module 21 includes a first insulating block 210, a plurality of first conductive terminals 211 fixed to the first insulating block 210, and a plurality of second conductive terminals 212 fixed to the first insulating block 210. In the illustrated embodiment of the present disclosure, the plurality of first conductive terminals 211 and the plurality of second conductive terminals 212 are insert-molded with the first insulating block 210. The first insulating block 210 is assembled and fixed to a bottom of the first mating slot 121. Of course, in other embodiments, there may be two first insulating blocks 210, which are respectively fixed to the plurality of first conductive terminals 211 and the plurality of second conductive terminals 212. The two first insulating blocks 210 may be provided with structures that cooperate with each other, so as to be directly or indirectly fixed together.

Each first conductive terminal 211 includes a first fixing portion 2110, a first elastic contact arm 2111 extending from one end of the first fixing portion 2110, and a first tail portion 2112 extending from another end of the first fixing portion 2110. The first fixing portion 2110 is fixed to the first insulating block 210. The first tail portion 2112 extends beyond the first insulating block 210. In the illustrated embodiment of the present disclosure, the first tail portion 2112 and the first fixing portion 2110 are located on a straight line along the first direction A1-A1. In this way, the length of the first conductive terminal 211 can be shortened as much as possible, which is beneficial to improve the quality of signal transmission.

Each second conductive terminal 212 includes a second fixing portion 2120, a second elastic contact arm 2121 extending from one end of the second fixing portion 2120, and a second tail portion 2122 extending from another end of the second fixing portion 2120. The second fixing portion 2120 is fixed to the first insulating block 210. The second tail portion 2122 extends beyond the first insulating block 210. In the illustrated embodiment of the present disclosure, the second tail portion 2122 and the second fixing portion 2120 are located on a straight line along the first direction A1-A1. In this way, the length of the second conductive terminal 212 can be shortened as much as possible, which is beneficial to improve the quality of signal transmission.

In the illustrated embodiment of the present disclosure, the first elastic contact arm 2111 and the second elastic contact arm 2121 extend into the first mating slot 121. The first elastic contact arm 2111 and the second elastic contact arm 2121 are located on two sides of the first mating slot 121, respectively. The first elastic contact arm 2111 protrudes toward the second elastic contact arm 2121. The second elastic contact arm 2121 protrudes toward the first elastic contact arm 2111. In this way, the first elastic contact arm 2111 and the second elastic contact arm 2121 can jointly clamp the tongue plate of the mating connector, so as to improve the mating reliability.

The first tail portions 2112 of the first conductive terminals 211 are configured to be fixed to the first row of conductive pads 2031 by soldering or welding. The second tail portions 2122 of the second conductive terminals 212 are configured to be fixed to the second row of conductive pads 2032 by soldering or welding. In the illustrated embodiment of the present disclosure, the first tail portions 2112 are surface mounted to the first row of conductive pads 2031 through solder balls. The second tail portions 2122 are surface mounted to the second row of conductive pads 2032 through solder balls.

Similarly, as shown in FIG. 15, the second terminal module 22 includes a second insulating block 220, a plurality of third conductive terminals 221 fixed to the second insulating block 220, and a plurality of fourth conductive terminals 222 fixed to the second insulating block 220. In the illustrated embodiment of the present disclosure, the plurality of third conductive terminals 221 and the plurality of fourth conductive terminals 222 are insert-molded with the second insulating block 220. The second insulating block 220 is assembled and fixed to a bottom of the second mating slot 122. Of course, in other embodiments, there may be two second insulating blocks 220, which are respectively fixed to the plurality of third conductive terminals 221 and the plurality of fourth conductive terminals 222. The two second insulating blocks 220 may be provided with structures that cooperate with each other, so as to be directly or indirectly fixed together.

Each third conductive terminal 221 includes a third fixing portion 2210, a third elastic contact arm 2211 extending from one end of the third fixing portion 2210, and a third tail portion 2212 extending from another end of the third fixing portion 2210. The third fixing portion 2210 is fixed to the second insulating block 220. The third tail portion 2212 extends beyond the second insulating block 220. In the illustrated embodiment of the present disclosure, the third tail portion 2212 and the third fixing portion 2210 are located on a straight line along the first direction A1-A1. In this way, the length of the third conductive terminal 221 can be shortened as much as possible, which is beneficial to improve the quality of signal transmission.

Each fourth conductive terminal 222 includes a fourth fixing portion 2220, a fourth elastic contact arm 2221 extending from one end of the fourth fixing portion 2220, and a fourth tail portion 2222 extending from another end of the fourth fixing portion 2220. The fourth fixing portion 2220 is fixed to the second insulating block 220. The fourth tail portion 2222 extends beyond the second insulating block 220. In the illustrated embodiment of the present disclosure, the fourth tail portion 2222 and the fourth fixing portion 2220 are located on a straight line along the first direction A1-A1. In this way, the length of the fourth conductive terminal 222 can be shortened as much as possible, which is beneficial to improve the quality of signal transmission.

In the illustrated embodiment of the present disclosure, the third elastic contact arm 2211 and the fourth elastic contact arm 2221 extend into the second mating slot 122. The third elastic contact arm 2211 and the fourth elastic contact arm 2221 are located on two sides of the second mating slot 122, respectively. The third elastic contact arm 2211 protrudes toward the fourth elastic contact arm 2221. The fourth elastic contact arm 2221 protrudes toward the third elastic contact arm 2211. In this way, the third elastic contact arm 2211 and the fourth elastic contact arm 2221 can jointly clamp the tongue plate of the mating connector, so as to improve the mating reliability.

The third tail portions 2212 of the third conductive terminals 221 are configured to be fixed to the third row of conductive pads 2033 by soldering or welding. The fourth tail portions 2222 of the fourth conductive terminals 222 are configured to be fixed to the fourth row of conductive pads 2034 by soldering or welding. In the illustrated embodiment of the present disclosure, the third tail portions 2212 are surface mounted to the third row of conductive pads 2033 through solder balls. The fourth tail portions 2222 are surface mounted to the fourth row of conductive pads 2034 through solder balls.

In the first embodiment shown in the present disclosure, the first tail portions 2112, the second tail portions 2122, the third tail portions 2212 and the fourth tail portions 2222 of the conductive terminal 2 are arranged in four rows along the second direction A2-A2.

The plurality of conductive terminals 2 include the plurality of first conductive terminals 211, the plurality of second conductive terminals 212, the plurality of third conductive terminals 221 and the plurality of fourth conductive terminals 222. The elastic contact arms include the first elastic contact arms 2111, the second elastic contact arms 2121, the third elastic contact arms 2211 and the fourth elastic contact arms 2221.

Of course, in other embodiments of the present disclosure, the plurality of first conductive terminals 211, the plurality of second conductive terminals 212, the plurality of third conductive terminals 221, and the plurality of fourth conductive terminals 222 can also be fixed to the insulating body 1 by assembling.

Referring to FIG. 4 and FIG. 6 to FIG. 12, in the embodiment shown in the present disclosure, the metal shielding cage 20 includes a first metal shell 3, a second metal shell 4 buckled together with the first metal shell 3, and an inner metal shell 5 fixed to the first metal shell 3.

Figure 7:
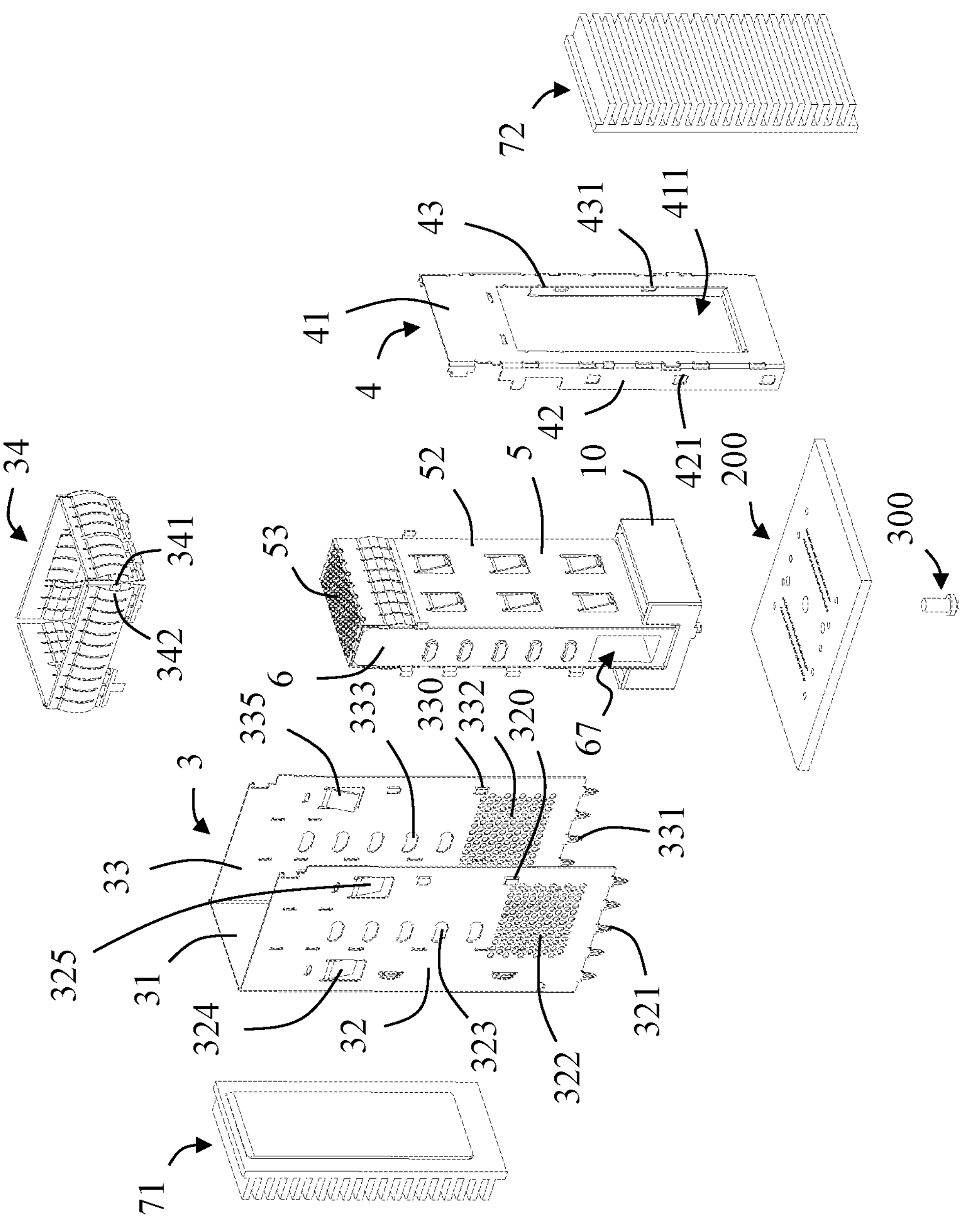
FIG. 7 is a further partial perspective exploded view of FIG. 4.
Figure 8:
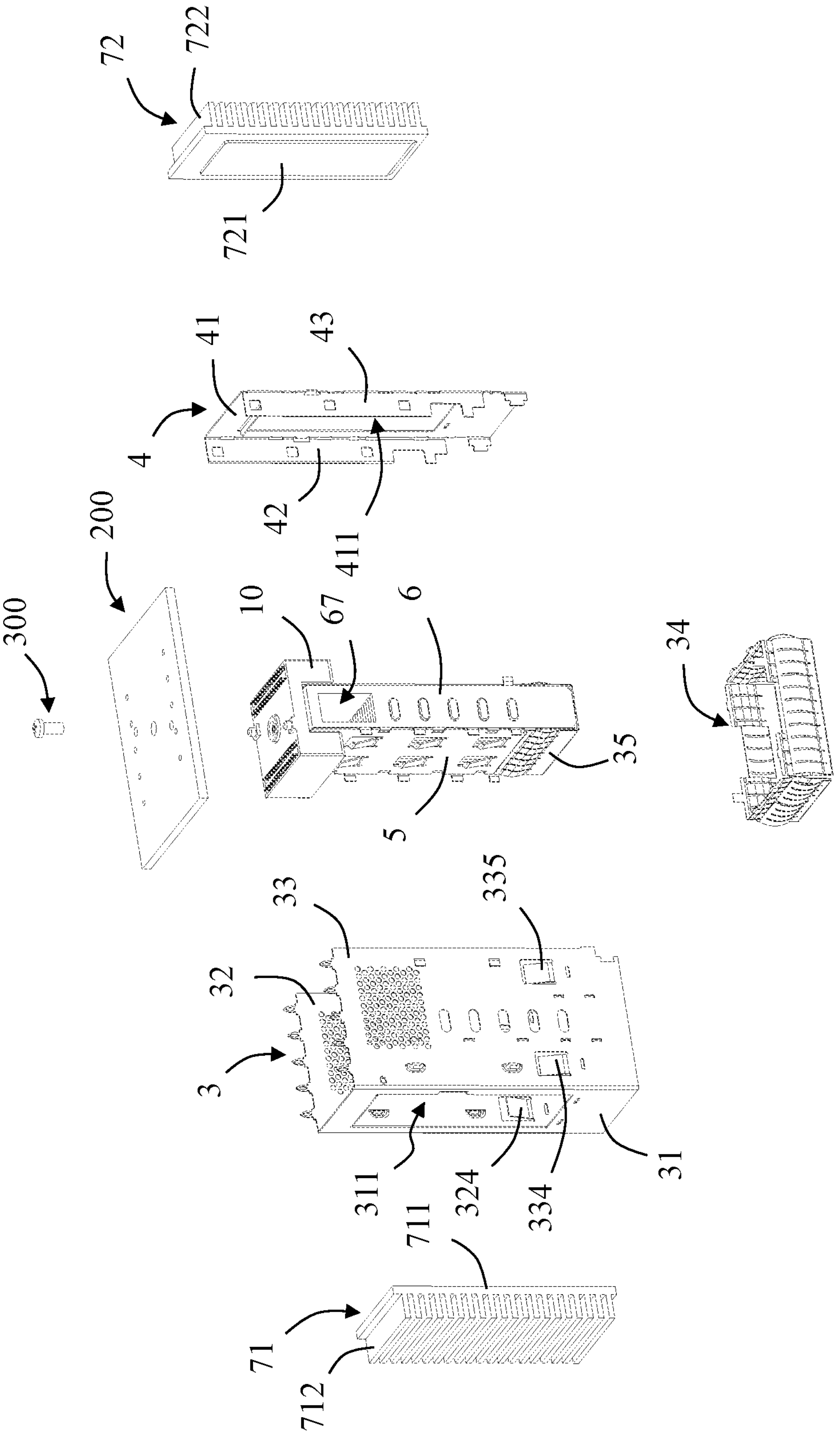
FIG. 8 is a partial perspective exploded view of FIG. 7 from another angle.

Referring to FIG. 7 and FIG. 8, in the embodiment shown in the present disclosure, the first metal shell 3 is substantially U-shaped, which includes a first end wall 31, a first side wall 32 perpendicularly bent from one end of the first end wall 31, and a second side wall 33 perpendicularly bent from another end of the first end wall 31. The first side wall 32 is substantially parallel to the second side wall 33. The first end wall 31 defines a first opening 311.

The second metal shell 4 is also substantially U-shaped, which includes a second end wall 41, a first buckling wall 42 perpendicularly bent from one end of the second end wall 41, and a second buckling wall 43 perpendicularly bent from another end of the second end wall 41. The second end wall 41 defines a second opening 411. In the illustrated embodiment of the present disclosure, the second metal shell 4 and the first metal shell 3 have asymmetric structures.

In an embodiment of the present disclosure, a bottom of the second end wall 41 is not in contact with the circuit board

200. Such arrangement is beneficial to the wiring of the circuit board 200 and reduces the risk of short circuit. Even, a gap between the second end wall 41 and the circuit board 200 can provide space for electronic components on the circuit board 200.

In another embodiment of the present disclosure, the bottom of the second end wall 41 is in contact with the circuit board 200, for example, is in contact with a ground path on the circuit board 200. Such arrangement is beneficial to improve the grounding effect between the second end wall 41 and the circuit board 200.

During assembly, the first buckling wall 42 is buckled and fixed to the first side wall 32; and the second buckling wall 43 is buckled and fixed to the second side wall 33. In the illustrated embodiment of the present disclosure, the first side wall 32 is provided with a plurality of first protruding pieces 320; and the first buckling wall 42 defines a plurality of first buckling holes 421 that are fastened with the first protruding pieces 320. Similarly, the second side wall 33 is provided with a plurality of second protruding pieces 330; and the second buckling wall 43 defines a plurality of second buckling holes 431 that are fastened with the second protruding pieces 330.

Figure 9:
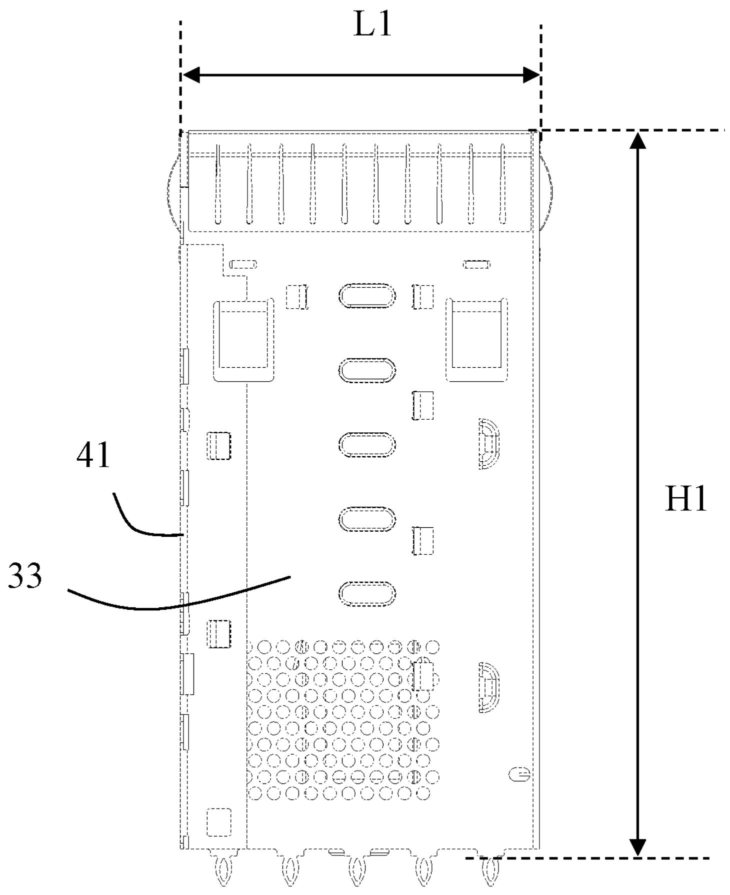
FIG. 9 is a rear view of a metal shielding cage in FIG. 4.
Figure 10:
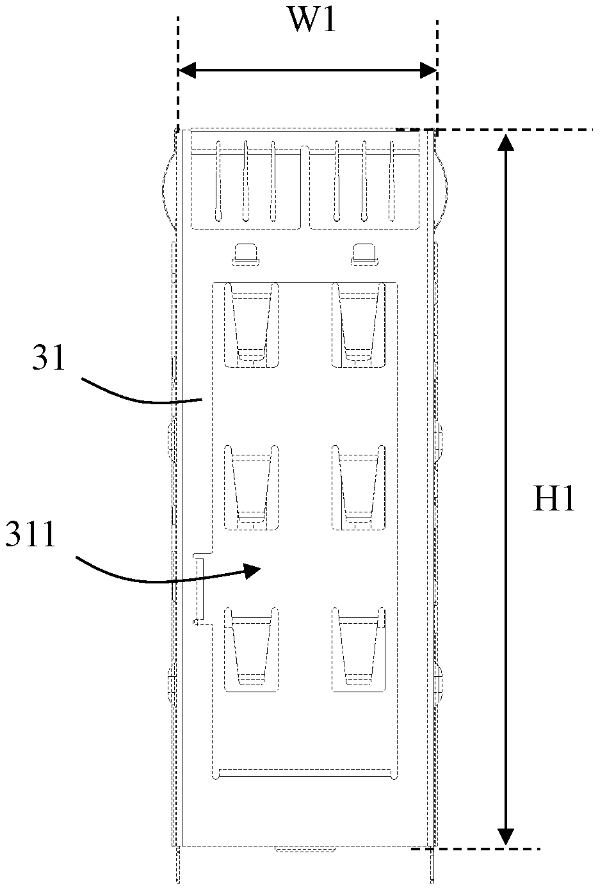
FIG. 10 is a left view of the metal shielding cage in FIG. 4.

After assembly, the first end wall 31, the first side wall 32, the second side wall 33 and the second end wall 41 are jointly enclosed to form the receiving chamber 30. Referring to FIG. 9 and FIG. 10, in the embodiment shown in the present disclosure, the metal shielding cage 20 is of an elevated vertical configuration. Specifically, the first end wall 31, the first side wall 32, and the second side wall 33 all have the same first height H1 along the first direction A1-A1. Both the first side wall 32 and the second side wall 33 have the same first length L1 along the second direction A2-A2. Both the first end wall 31 and the second end wall 41 have the same first width W1 along the third direction A3-A3. In the illustrated embodiment of the present disclosure, the first height H1 is greater than the first length L1; the first height H1 is greater than the first width W1; and the first length L1 is greater than the first width W1. In the illustrated embodiment of the present disclosure, the first height H1 is greater than at least twice the first length L1, and the first height H1 is greater than at least twice the first width W1, that is H1>2*L1, and H1>2*W1.

The metal shielding cage 20 of the present disclosure is of the elevated vertical configuration, in which the first height H1 is greater than the first length L1, and the first height H1 is greater than the first width W1. Compared with the arrangement of the metal shielding cage parallel to the circuit board in the prior art, the arrangement of the present disclosure is beneficial to save an occupied area of the circuit board 200. Under the same conditions, the arrangement of the present disclosure is beneficial to enable the circuit board 200 to arrange more electronic components. At the same time, the metal shielding cage 20 of the present disclosure is prone to the risk of tilting under the action of external force due to its high height. The illustrated first embodiment of the present disclosure will also specifically explain how to solve this technical problem, which will be described in detail hereinafter.

The first metal shell 3 further includes a plurality of first fastening feet 321 protruding downwardly from a bottom edge of the first side wall 32 along the first direction A1-A1, a plurality of first heat dissipation holes 322 adjacent to a bottom of the first side wall 32 along the first direction A1-A1, and a plurality of first mounting holes 323 located above the plurality of first heat dissipation holes 322 along the first direction A1-A1. In the illustrated embodiment of the present disclosure, each first fastening foot 321 is fish-eye-shaped, and includes a first fish-eye hole 3211, so that the first fastening foot 321 has a certain elastic deformation capability. The first fastening feet 321 are configured to be pressed into the first row of fastening holes 2061 of the circuit board 200, so as to be electrically connected to the circuit board 200, for example, for grounding purpose.

The first metal shell 3 further includes a plurality of second fastening feet 331 protruding downwardly from a bottom edge of the second side wall 33 along the first direction A1-A1, a plurality of second heat dissipation holes 332 adjacent to a bottom of the second side wall 33 along the first direction A1-A1, and a plurality of second mounting holes 333 located above the plurality of second heat dissipation holes 332 along the first direction A1-A1. In the illustrated embodiment of the present disclosure, each second fastening foot 331 is fish-eye-shaped, and includes a second fish-eye hole 3311, so that the second fastening foot 331 has a certain elastic deformation capability. The second fastening feet 331 are configured to be pressed into the second row of fastening holes 2062 of the circuit board 200, so as to be electrically connected to the circuit board 200, for example, for grounding purpose.

In the illustrated embodiment of the present disclosure, the first end wall 31 and the second end wall 41 are not provided with any fastening foot configured to fix the first end wall 31 and the second end wall 41 to the circuit board 200. With such arrangement, on one hand, it simplifies the structure of the first end wall 31 and the second end wall 41; on the other hand, since the first end wall 31 and the second end wall 41 are provided with the first opening 311 and the second opening 411, respectively, the absence of the fixing foot is beneficial to avoid the structural strength of the first end wall 31 and the second end wall 41 from being too high due to the assembly of the first end wall 31 and the second end wall 41 to the circuit board 200.

Figure 12:
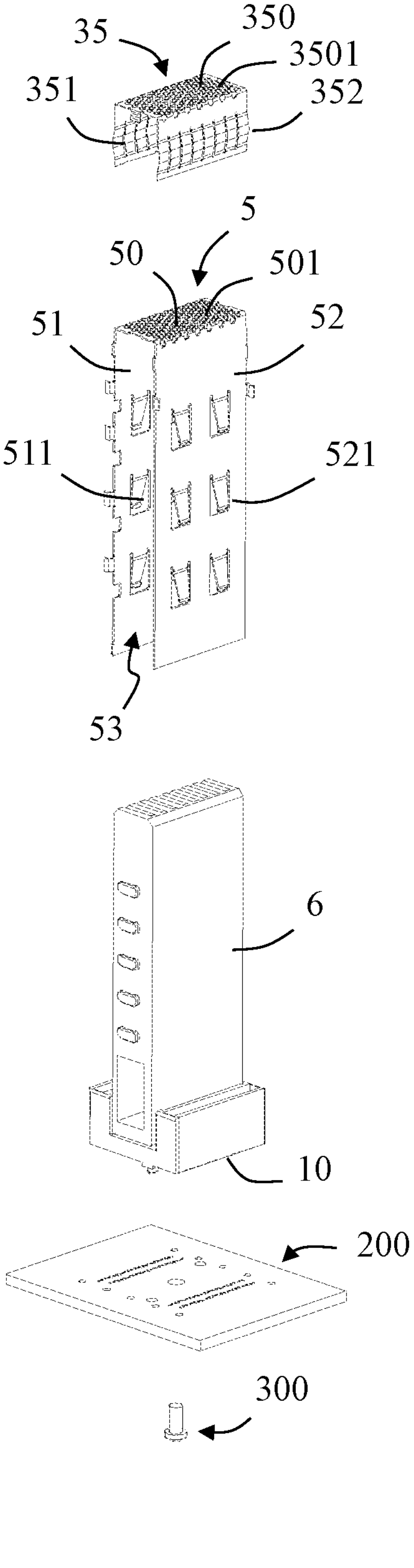
FIG. 12 is a perspective schematic view of an inner metal shell, a second ground elastic piece, a mounting block, an electrical connector, the circuit board and the fastener, wherein the mounting block is assembled with the electrical connector.

Referring to FIG. 12, the inner metal shell 5 is substantially U-shaped, which includes a top wall 50, a first fixing wall 51 bent downwardly from one side of the top wall 50, and a second fixing wall 52 bent downwardly from another side of the top wall 50. In the illustrated embodiment of the present disclosure, the top wall 50 is provided with a plurality of first heat dissipation holes 501. Two sides of the first fixing wall 51 are fixed to the first side wall 32 and the second side wall 33, respectively. Two sides of the second fixing wall 52 are fixed to the first side wall 32 and the second side wall 33, respectively.

Figure 11:
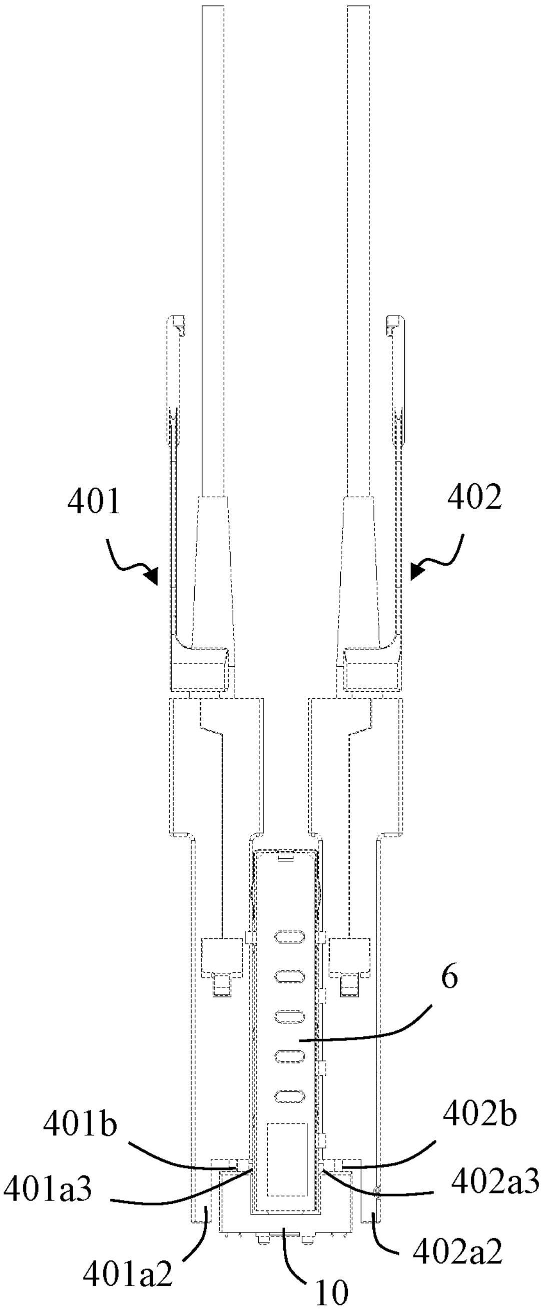
FIG. 11 is a front view of the first mating connector and the second mating connector in FIG. 1 inserted into the connector assembly after removing a first metal shell and a second metal shell.
Figure 18:
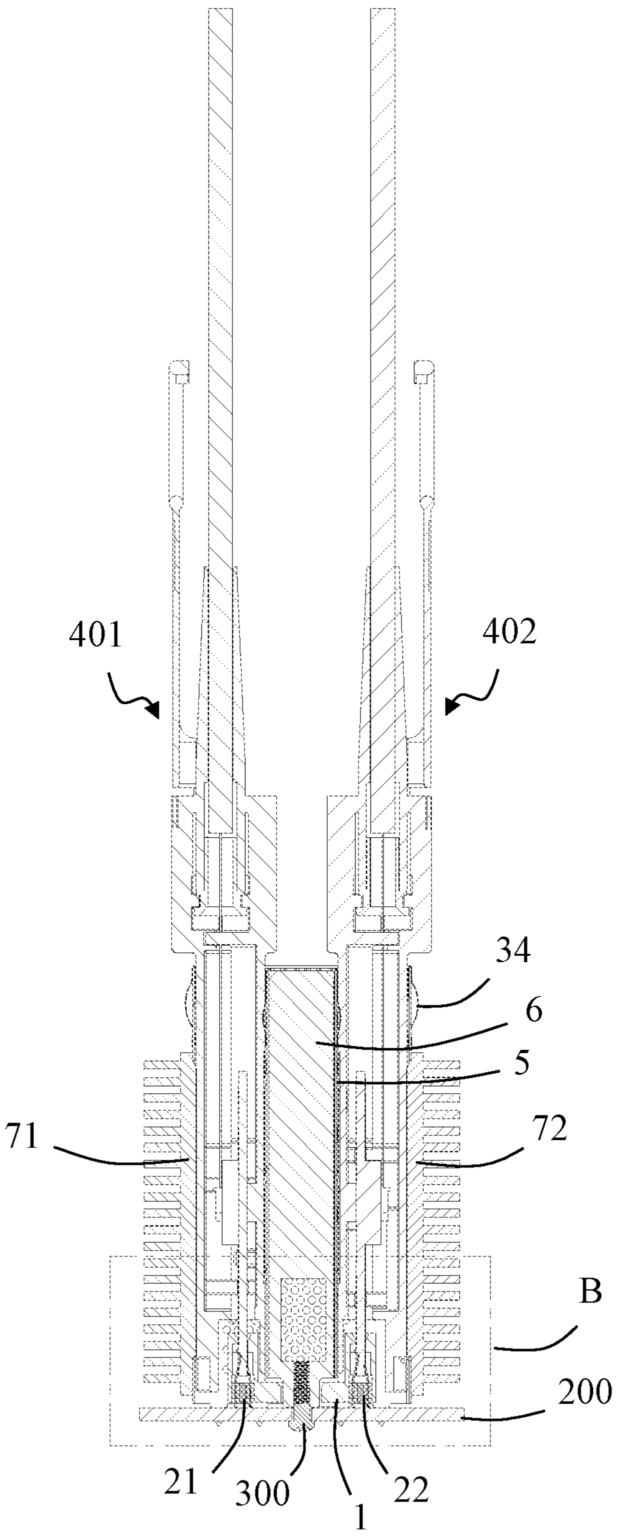
FIG. 18 is a schematic sectional view taken along line C-C in FIG. 1.
Figure 19:
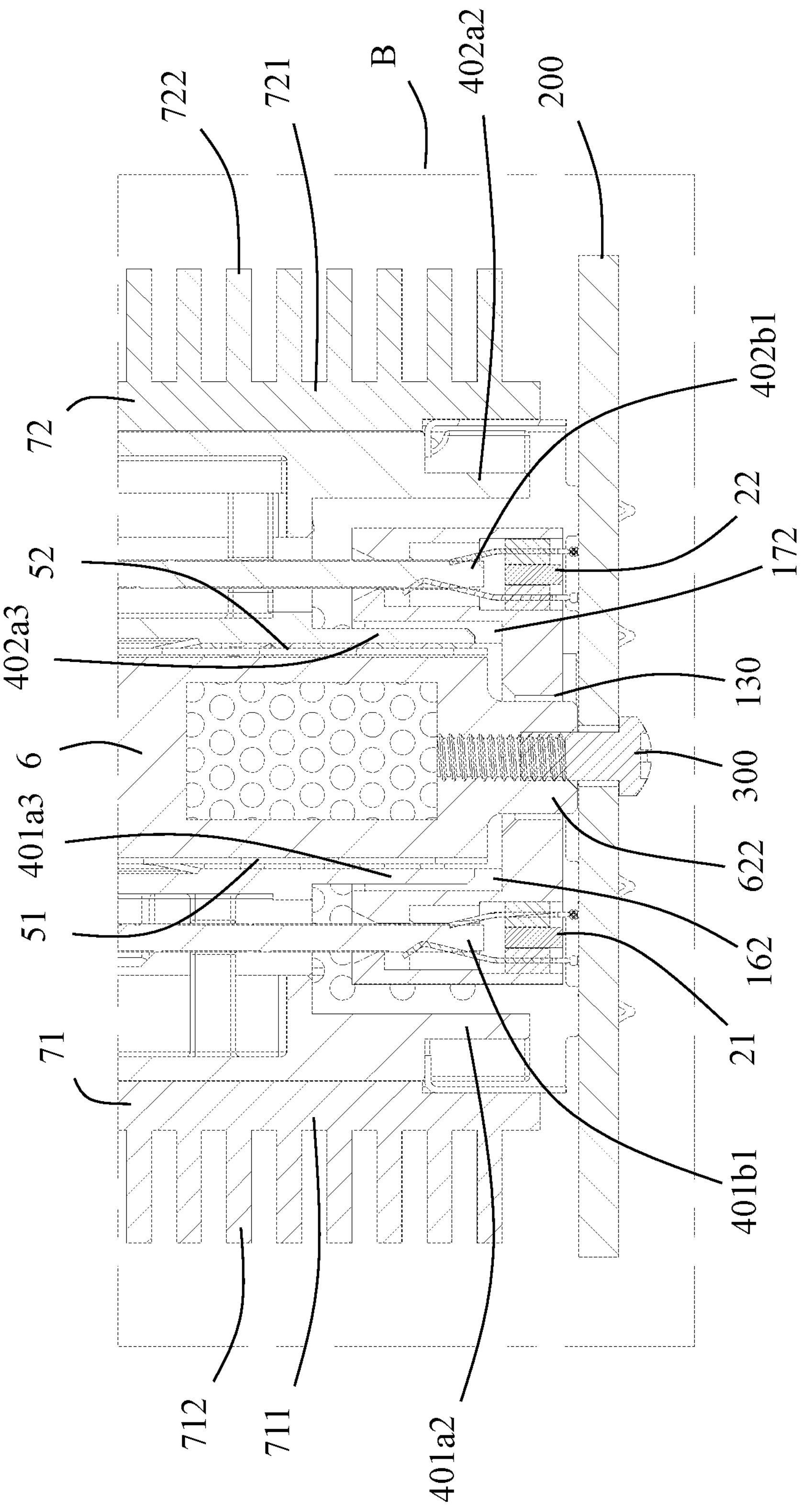
FIG. 19 is a partial enlarged view of a frame part B in FIG. 18.

Referring to FIG. 11, FIG. 18 and FIG. 19, the inner metal shell 5 divides the receiving chamber 30 into a first receiving chamber 301 and a second receiving chamber 302 which are located on two sides of the inner metal shell 5, respectively. The first receiving chamber 301 and the first mating slot 121 are in communication for receiving the first mating connector 401. The first main body portion 401*a*1 of the first mating connector 401 is substantially received in the first receiving chamber 301. The first tongue plate 401*b*1 of the first mating connector 401 is inserted into the first mating slot 121. The first metal pads 401*b*2 of the first tongue plate 401*b*1 abut against the first elastic contact arms 2111 and the second elastic contact arms 2121, respectively. The first positioning tab 401*a*3 of the first mating connector 401 is inserted into the first positioning slot 162. The first extending tab 401*a*2 of the first mating connector 401 is inserted into an outer side of the first extension protrusion 14 away from the first positioning slot 162, and is attached to on the outside of the first extension protrusion 14.

Similarly, the second receiving chamber 302 and the second mating slot 122 are in communication for receiving the second mating connector 402. The second main body portion **402*a*1 of the second mating connector 402 is substantially received in the second receiving chamber 302. The second tongue plate 402*b*1 of the second mating connector 402 is inserted into the second mating slot 122. The second metal pads 402*b*2 of the second tongue plate 402*b*1 abut against the third elastic contact arms 2211 and the fourth elastic contact arms 2221, respectively. The second positioning tab 402*a*3 of the second mating connector 402 is inserted into the second positioning slot 172. The second extending tab 402*a*2 of the second mating connector 402 is inserted into an outer side of the second extension protrusion 15 away from the second positioning slot 172, and is attached to the outside of the second extension protrusion 15**.

In the illustrated embodiment of the present disclosure, the first side wall 32 is provided with a first elastic arm 324 protruding into the first receiving chamber 301. The second side wall 33 is provided with a second elastic arm 334 protruding into the first receiving chamber 301. The first fixing wall 51 is provided with a third elastic arm 511 protruding into the first receiving chamber 301. The first elastic arm 324, the second elastic arm 334 and the third elastic arm 511 are configured to abut against the first main body portion **401*a*1 of the first mating connector 401. In this way, on one hand, the first elastic arm 324, the second elastic arm 334 and the third elastic arm 511 can increase the insertion and extraction force when inserting the first mating connector 401, thereby improving the mating reliability; on the other hand, the first elastic arm 324, the second elastic arm 334 and the third elastic arm 511 are also beneficial to transfer the heat generated when the first mating connector 401 is working to the metal shielding cage 20**.

Similarly, the first side wall 32 is provided with a fourth elastic arm 325 protruding into the second receiving chamber 302. The second side wall 33 is provided with a fifth elastic arm 335 protruding into the second receiving chamber 302. The second fixing wall 52 is provided with a sixth elastic arm 521 protruding into the second receiving chamber 302. The fourth elastic arm 325, the fifth elastic arm 335 and the sixth elastic arm 521 are configured to abut against the second main body portion **402*a*1 of the second mating connector 402. In this way, on one hand, the fourth elastic arm 325, the fifth elastic arm 335 and the sixth elastic arm 521 can increase the insertion and extraction force when inserting the second mating connector 402, thereby improving mating reliability; and on the other hand, the fourth elastic arm 325, the fifth elastic arm 335 and the sixth elastic arm 521 are also beneficial to transfer the heat generated when the second mating connector 402 is working to the metal shielding cage 20**.

Referring to FIG. 4, FIG. 7 and FIG. 8, in the embodiment shown in the present disclosure, in order to improve the grounding effect with the mating connector 400, the metal shielding cage 20 also includes a plurality of first ground elastic pieces 34 fixed to a top of the first end wall 31, the first side wall 32, the second side wall 33 and the second end wall 41. Each first ground elastic piece 34 includes a first elastic arm 341 protruding into the receiving chamber 30 and a second elastic arm 342 located outside the receiving chamber 30. Of course, in other embodiments, the first ground elastic pieces 34 of the metal shielding cage 20 may also be omitted.

The metal shielding cage 20 also includes a second ground elastic piece 35 fixed to the inner metal shell 5. In the illustrated embodiment of the present disclosure, the second ground elastic piece 35 is substantially U-shaped, which includes a top end wall 350, a third elastic arm 351 bent downwardly from one side of the top end wall 350, and a fourth elastic arm 352 bent downwardly from another end of the top end wall 350. The top end wall 350 abuts against the top wall 50, and the top end wall 350 is provided with a plurality of second heat dissipation holes 3501 aligned with the plurality of first heat dissipation holes 501. The third elastic arm 351 is located outside the first fixing wall 51 and protrudes into the first receiving chamber 301. The fourth elastic arm 352 is located outside the second fixing wall 52 and protrudes into the second receiving chamber 302. The third elastic arm 351 is configured to abut against the first main body portion **401*a*1 of the first mating connector 401. The fourth elastic arm 352 is configured to abut against the second main body portion 402*a*1 of the second mating connector 402. Of course, in other embodiments, the second ground elastic piece 35 of the metal shielding cage 20** may also be omitted.

Referring to FIG. 12, in the embodiment shown in the present disclosure, the inner metal shell 5 also includes a U-shaped opening 53. The connector sub-assembly 100 also includes a mounting block 6 installed in the opening 53. The shape and size of the mounting block 6 match the opening 53.

Referring to FIG. 12 to FIG. 14 and FIG. 17, the mounting block 6 includes a top wall portion 61, a bottom wall portion 62, a first wall portion 63, a second wall portion 64 opposite to the first wall portion 63, a third wall portion 65 connecting one end of the first wall portion 63 and one end of the second wall portion 64, and a fourth wall portion 66 connecting another end of the first wall portion 63 and another end of the second wall portion 64. The bottom wall portion 62 has a bottom wall surface 621 and a mounting post 622 protruding downwardly beyond the bottom wall surface 621. The mounting post 622 has an internal threaded hole 6221. In one embodiment of the present disclosure, the mounting block 6 is a metal block made of metal material. The top wall portion 61 of the mounting block 6 abuts against the bottom of the top wall 50 of the inner metal shell 5.

The first wall portion 63 has a first wall surface 631 and a plurality of first mounting protrusions 632 protruding from the first wall surface 631. The plurality of first mounting protrusions 632 are configured to be locked in the corresponding first mounting holes 323.

The second wall portion 64 has a second wall surface 641 and a plurality of second mounting protrusions 642 protruding from the second wall surface 641. The plurality of second mounting protrusions 642 are configured to be fixed in the corresponding second mounting holes 333.

At a position adjacent to the bottom wall portion 62, the mounting block 6 further includes a heat dissipation through hole 67 extending through the first wall surface 631 and the second wall surface 641. Referring to FIG. 19, in the illustrated embodiment of the present disclosure, the internal threaded hole 6221 of the mounting post 622 communicates with the heat dissipation through hole 67 in the first direction A1-A1, so as to better realize the heat dissipation function. The mounting block 6 further includes a plurality of heat dissipation channels 68 extending through the third wall portion 65 and arranged at intervals. The plurality of heat dissipation channels 68 extend upwardly through the top wall portion 61. The plurality of heat dissipation channels 68 communicate downwardly with the heat dissipation through hole 67. The plurality of heat dissipation channels 68 communicate upwardly with the first heat dissipation holes

501 and the second heat dissipation through holes 3501. In this way, the heat at the bottom can pass through the heat dissipation through hole 67, pass through the plurality of heat dissipation channels 68, the first heat dissipation holes 501 and the second heat dissipation holes 3501, and can be dissipated upwardly to the external environment along the first direction A1-A1. Meanwhile, the heat dissipation through hole 67 correspond to the heights of the first heat dissipation holes 322 and the second heat dissipation holes 332 in the first direction A1-A1. The heat dissipation through hole 67, the first heat dissipation holes 322 and the second heat dissipation holes 332 are in communication, so that the heat can also flow from the first heat dissipation holes 322, the heat dissipation through hole 67 and the second heat dissipation holes 332 to be dissipated into the environment along the third direction A3-A3.

In the embodiment shown in the present disclosure, a bottom of the mounting block 6, a bottom of the first fixing wall 51, and a bottom of the second fixing wall 52 are all accommodated in the receiving groove 16 of the insulating body 1. The first positioning slot 162 is located outside the first fixing wall 51. The second positioning slot 172 is located outside the second fixing wall 52.

Referring to FIG. 6 and FIG. 19, in the illustrated embodiment of the present disclosure, the mounting post 622 is inserted into the through hole 130 of the insulating body 1. The fastener 300 passes through the mounting through hole 204 from an opposite side of the circuit board 200 and is fixed in the mounting post 622. In the illustrated embodiment of the present disclosure, the fastener 300 is a bolt. An external thread of the bolt cooperates with the internal thread hole 6221 of the mounting post 622, so as to fasten the mounting block 6 to the circuit board 200. Of course, it is understandable to those skilled in the art that the fastener 300 can also be in other forms, which will not be repeated in the present disclosure. In the illustrated embodiment of the present disclosure, the mounting block 6 is made of metal material, so its structural strength is better, which is beneficial to improve the installation reliability with the circuit board 200 through the fastener 300. The mounting block 6 can not only provide heat dissipation, but also provide better support for the elevated metal shielding cage 20 of the present disclosure, thereby reducing the risk of the metal shielding cage 20 being tilted due to external force. In addition, the mounting block 6 made of metal material can better separate the first receiving chamber 301 and the second receiving chamber 302, which is beneficial to improve the shielding effect and improve the quality of data transmission.

Of course, it is understandable to those skilled in the art that the mounting block 6 may not be provided with the mounting post 622. At this time, the internal threaded hole 6221 may be formed on the bottom wall portion 62. Through the cooperation of the fastener 300 and the internal threaded hole 6221, the purpose of fastening the mounting block 6 to the circuit board 200 can also be achieved. In the illustrated embodiment of the present disclosure, the bottom of the mounting block 6 is spaced from the base portion 13 of the insulating body 1 in the first direction A1-A1 by a certain distance, so as to facilitate air circulation for better heat dissipation.

It is understandable to those skilled in the art that in the present disclosure, the fastener 300 can also be directly fastened to the electrical connector 10 through the mounting through hole 204 of the circuit board 200, so as to achieve the purpose of fastening the electrical connector 10 to the circuit board 200. In one embodiment of the present disclosure, the fastener 300 is directly fastened to the insulating body 1 through the mounting through hole 204 of the circuit board 200. At this time, the insulating body 1 may be provided with an internal threaded hole. The fastener 300 is a bolt and is fastened in the internal threaded hole of the insulating body 1. It is understandable to those skilled in the art that the fastener 300 can also be in other forms, which will not be repeated in the present disclosure. In addition, in this embodiment, the connector sub-assembly 100 may not be provided with the mounting block 6.

In the illustrated embodiment of the present disclosure, the connector sub-assembly 100 further includes a heat sink fixed to the metal shielding cage 20. Referring to FIG. 4, FIG. 7 and FIG. 8, in the embodiment shown in the present disclosure, the heat sink includes a first heat sink 71 fixed to the first end wall 31 and a second heat sink 72 fixed to the second end wall 41. A superordinate concept of the heat sink and the mounting block 6 is a heat dissipation element, that is, the heat dissipation element includes the heat sink and/or the mounting block 6.

In one embodiment of the present disclosure, the first heat sink 71 includes a first body portion 711 and a plurality of first heat dissipation fins 712 protruding sidewardly from the first body portion 711. In one embodiment of the present disclosure, the first body portion 711 is fixed to an outer side of the first end wall 31. The plurality of first heat dissipation fins 712 protrude outwardly beyond the first end wall 31. The plurality of first heat dissipation fins 712 are equally spaced along the first direction A1-A1. In the illustrated embodiment of the present disclosure, the first body portion 711 is fixed to the outer side of the first end wall 31 by soldering or welding. The first body portion 711 at least partially extends inward into the first opening 311 and is exposed in the first receiving chamber 301. The first body portion 711 is configured to be in contact with the first main body portion **401*a*1 of the first mating connector 401 to achieve better heat dissipation for the first mating connector 401**.

Similarly, in one embodiment of the present disclosure, the second heat sink 72 includes a second body portion 721 and a plurality of second heat dissipation fins 722 protruding sidewardly from the second body portion 721. In one embodiment of the present disclosure, the second body portion 721 is fixed to an outside of the second end wall 41. The plurality of second heat dissipation fins 722 protrude outwardly beyond the second end wall 41. The plurality of second heat dissipation fins 722 are equally spaced along the first direction A1-A1. In the illustrated embodiment of the present disclosure, the second body portion 721 is fixed to the outer side of the second end wall 41 by soldering or welding. The second body portion 721 at least partially extends inward into the second opening 411 and is exposed in the second receiving chamber 302. The second body portion 721 is configured to be in contact with the second main body portion **402*a*1 of the second mating connector 402 to achieve better heat dissipation for the second mating connector 402**.

Referring to FIG. 19, in the first embodiment illustrated in the present disclosure, both the first heat sink 71 and the second heat sink 72 are spaced a certain distance from the circuit board 200 along the first direction A1-A1.

Figure 20:
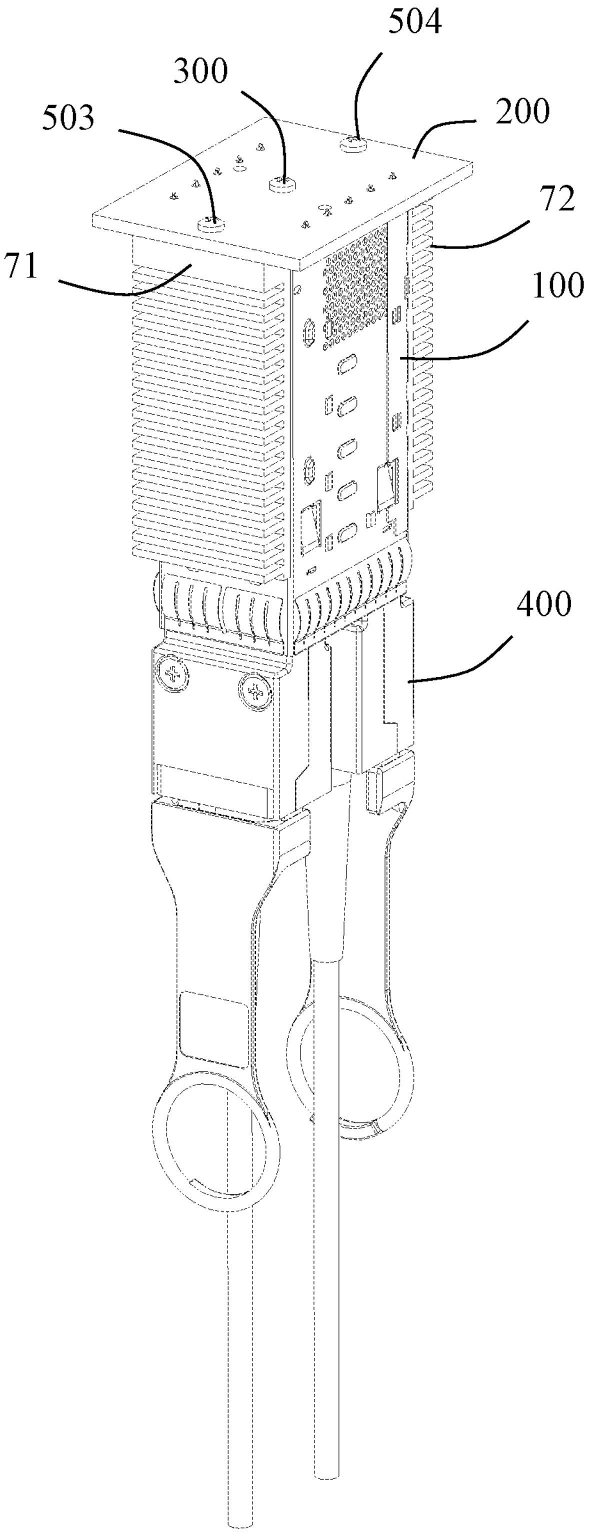
FIG. 20 is a schematic perspective view of the connector assembly in accordance with a second embodiment of the present disclosure.
Figure 21:
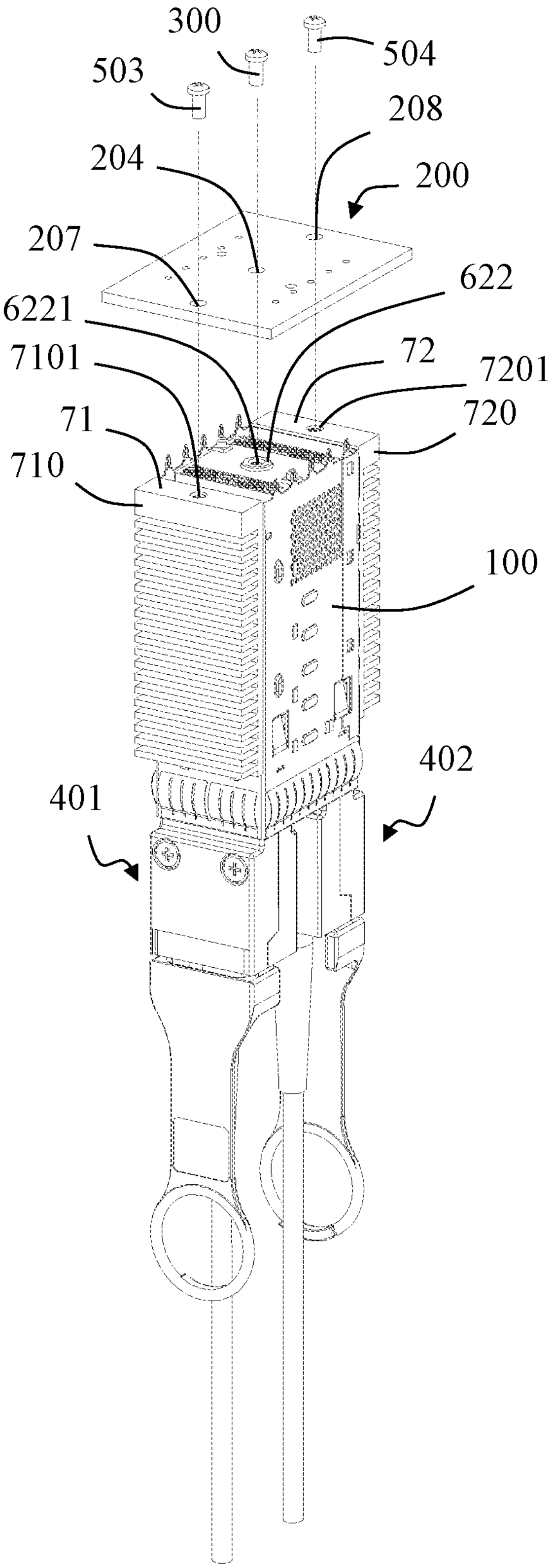
FIG. 21 is a partial perspective exploded view of FIG. 20.
Figure 22:
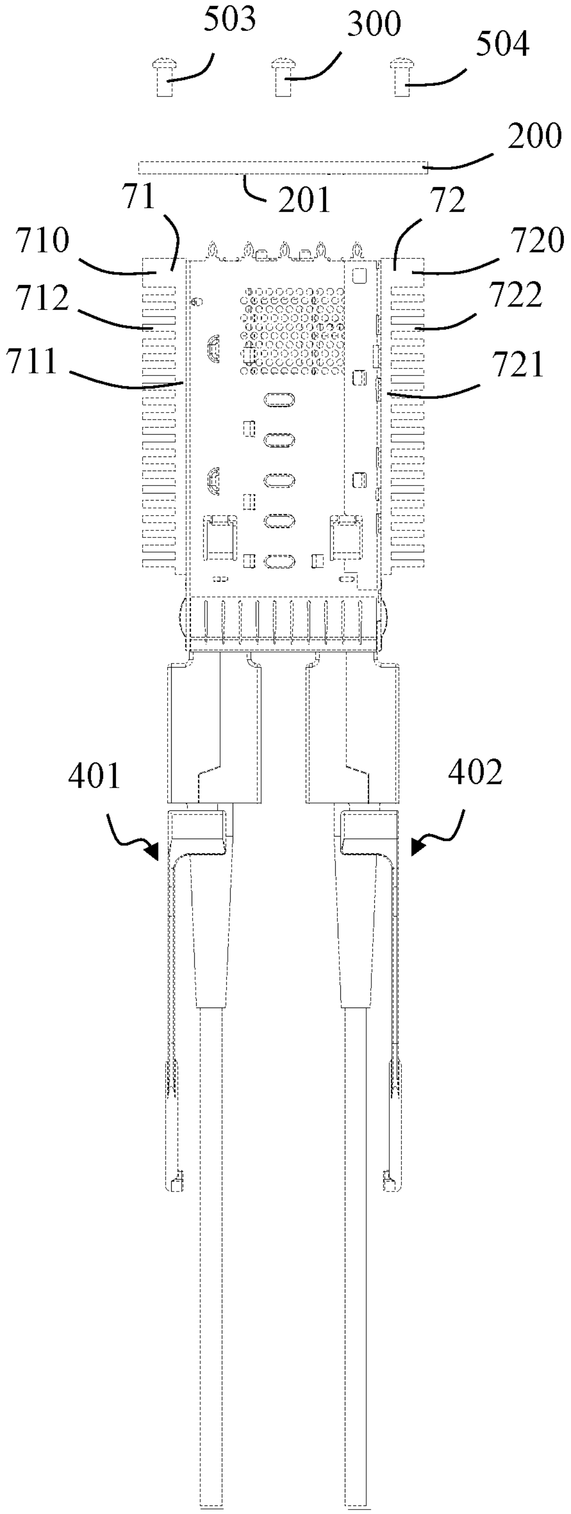
FIG. 22 is a front view of FIG. 21.
Figure 23:
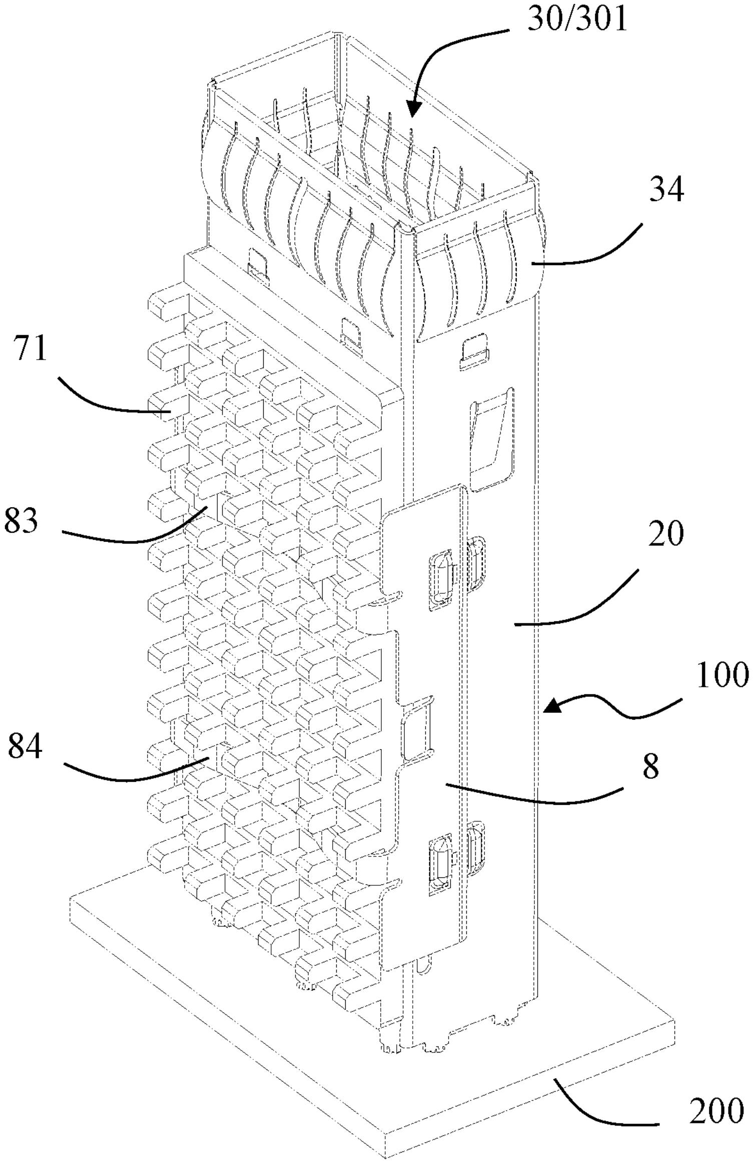
FIG. 23 is a schematic perspective view of the connector assembly in accordance with a third embodiment of the present disclosure.
Figure 24:
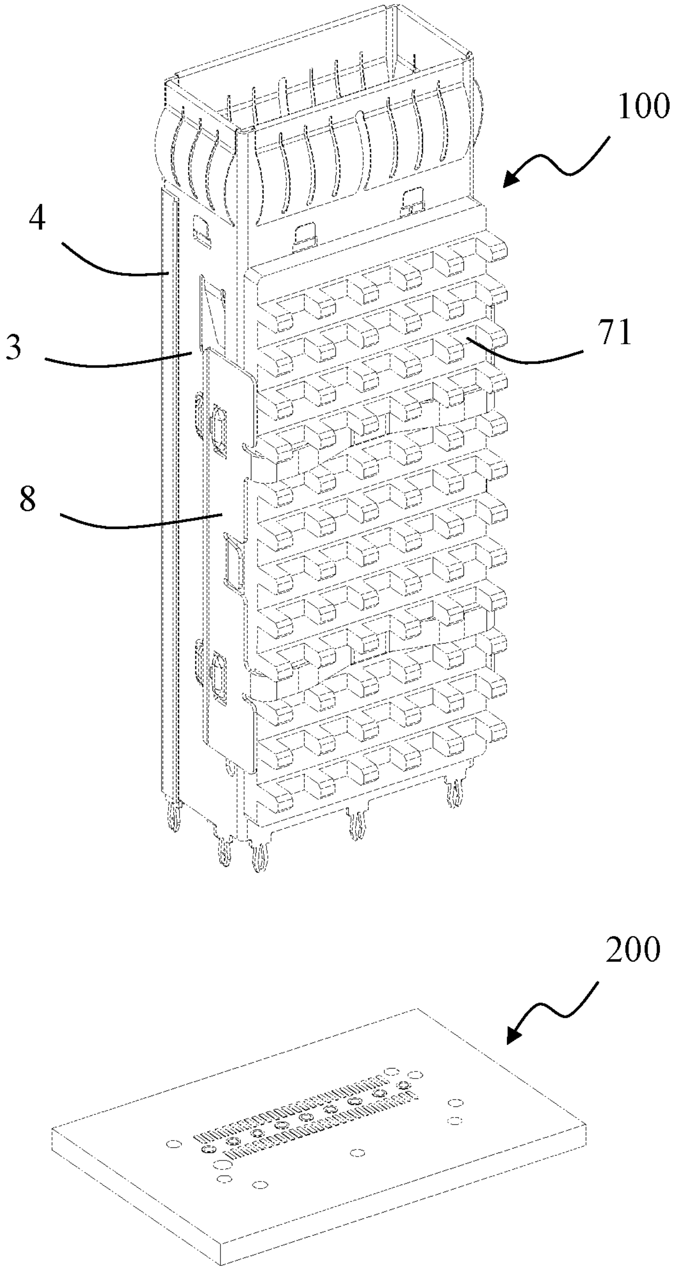
FIG. 24 is a partial perspective exploded view of FIG. 23.

Referring to FIG. 20 to FIG. 22, in the second embodiment of the connector sub-assembly 100 of the present disclosure, the first heat sink 71 includes a first base 710 at the bottom thereof. The plurality of first heat dissipation fins 712 are located above the first base 710 and distributed at equal intervals along the first direction A1-A1. Both the first base 710 and the first heat dissipation fins 712 are connected to the first body portion 711. A thickness of the first base 710 along the first direction A1-A1 is greater than a thickness of each first heat dissipation fin 712 along the first direction A1-A1. The first base 710 abuts against the first surface 201 of the circuit board 200. The first base 710 is provided with a first internal threaded hole 7101.

Similarly, in the second embodiment of the connector sub-assembly 100 of the present disclosure, the second heat sink 72 includes a second base 720 at the bottom thereof. The plurality of second heat dissipation fins 722 are located above the second base 720 and distributed at equal intervals along the first direction A1-A1. Both the second base 720 and the second heat dissipation fins 722 are connected to the second body portion 721. A thickness of the second base 720 along the first direction A1-A1 is greater than a thickness of each second heat dissipation fin 722 along the first direction A1-A1. The second base 720 abuts against the first surface 201 of the circuit board 200. The second base 720 is provided with a second internal threaded hole 7201.

The circuit board 200 includes a first locking hole 207 and a second locking hole 208. Both the first locking hole 207 and the second locking hole 208 extend through the first surface 201 and the second surface 202 of the circuit board 200.

The connector assembly further includes a first fastening member 503 passing through the first locking hole 207 of the circuit board 200 to be fastened to the first base 710, and a second fastening member 504 passing through the second locking hole 208 of the circuit board 200 to be fastened to the second base 720. In this way, the elevated metal shielding cage 20 of the present disclosure can be more firmly fixed to the circuit board 200. In the present disclosure, a superordinate concept of the first fastening member 503 and the second fastening member 504 is a fastening member. That is, the fastening member includes the first fastening member 503 and/or the second fastening member 504.

Referring to FIG. 23 to FIG. 31, in the third embodiment of the connector assembly of the present disclosure, the connector assembly includes a circuit board 200 and a connector sub-assembly 100 mounted on the circuit board 200. The connector sub-assembly 100 includes an electrical connector 10 and a metal shielding cage 20 shielding a periphery of the electrical connector 10. The metal shielding cage 20 is provided with a receiving chamber 30 (for example, a first receiving chamber 301). The receiving chamber 30 is configured to receive the mating connector 400 (for example, the first mating connector 401) along a first direction A1-A1 (for example, a top-bottom direction). The first direction A1-A1 is perpendicular to the circuit board 200. In the illustrated embodiment of the present disclosure, the connector sub-assembly 100 has only one port corresponding to the receiving chamber 30 for receiving the first mating connector 401. The structure of the first mating connector 401 is shown in FIG. 2 and FIG. 3, which will not be repeated here.

Figure 25:
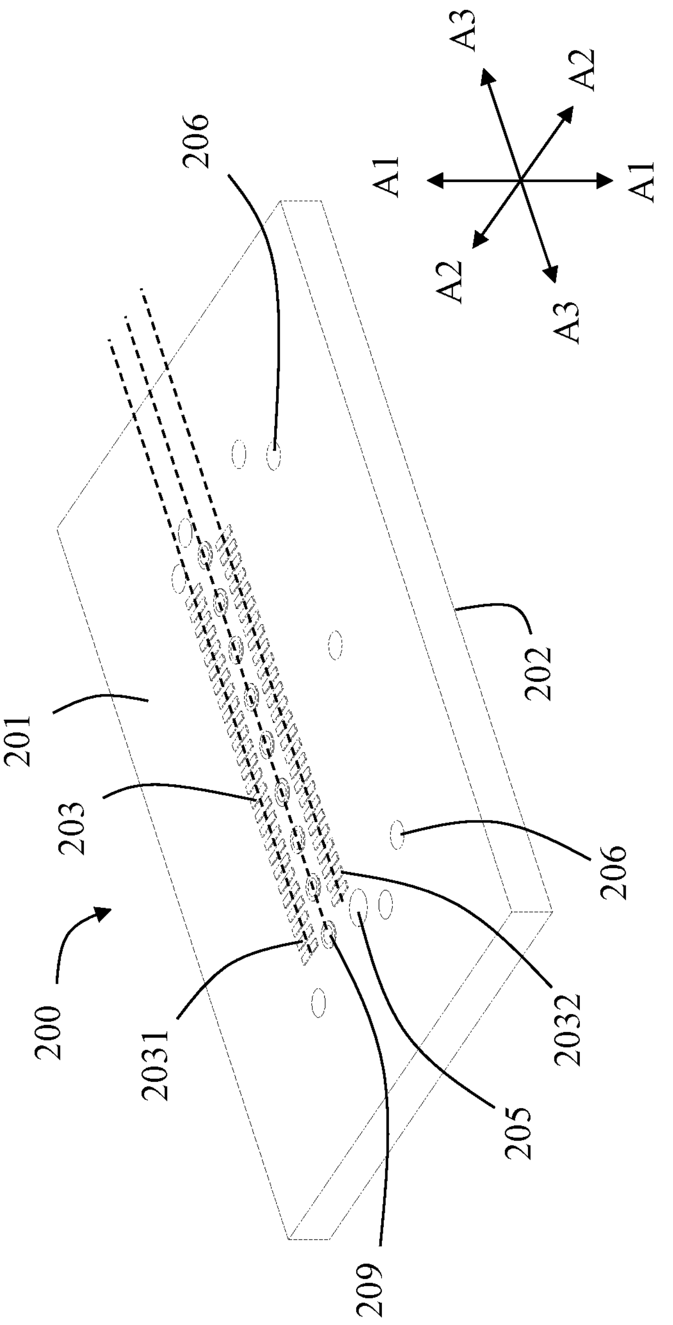
FIG. 25 is a schematic perspective view of the circuit board in FIG. 24.
Figure 26:
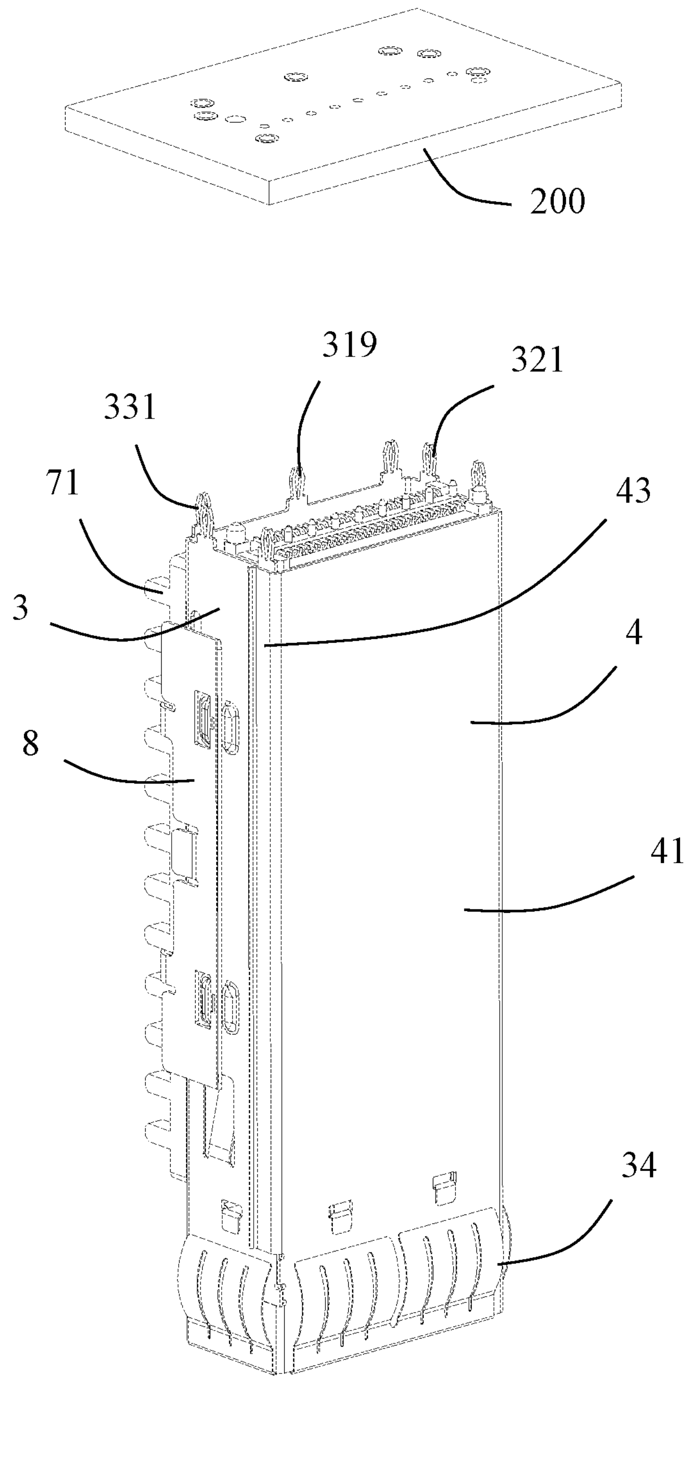
FIG. 26 is a partial perspective exploded view of FIG. 24 from another angle.
Figure 27:
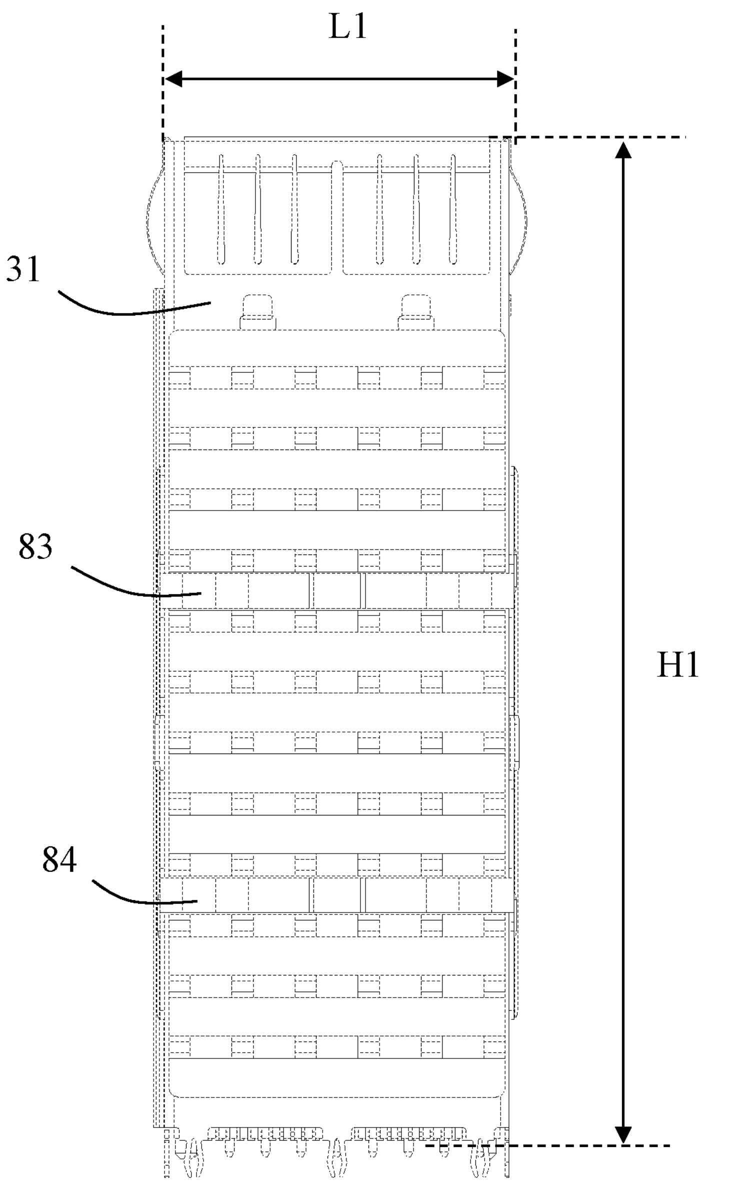
FIG. 27 is a front view of the connector assembly in FIG. 23.
Figure 28:
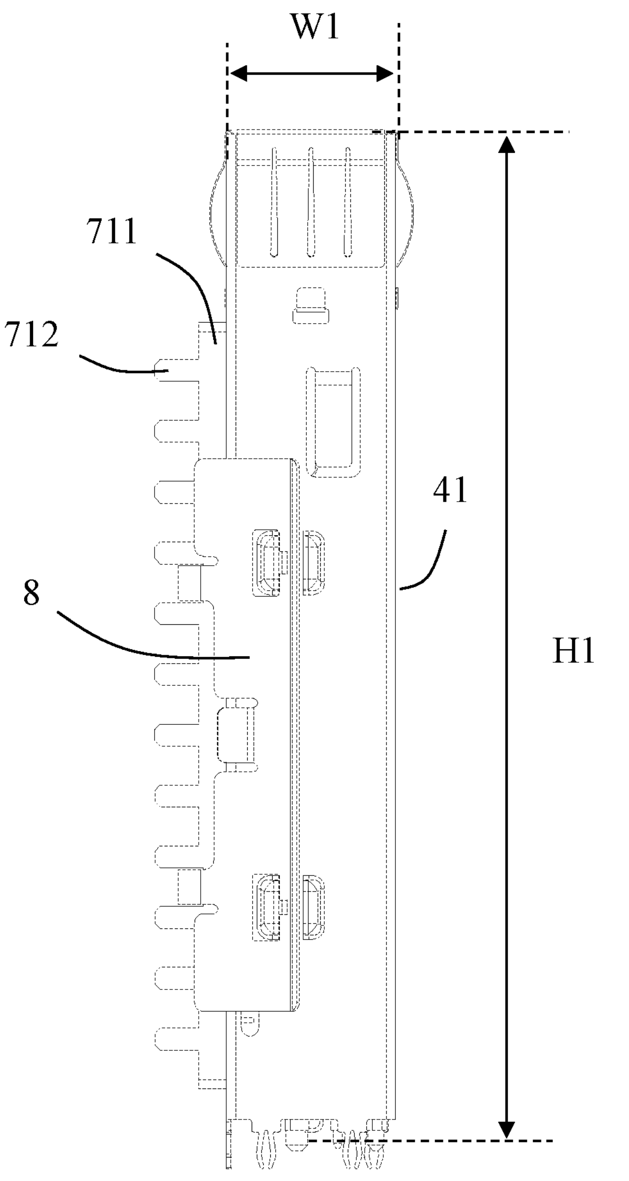
FIG. 28 is a right side view of the connector assembly in FIG. 23.

Referring to FIG. 25, the circuit board 200 includes a first surface 201 (for example, an upper surface), a second surface 202 (for example, a lower surface) opposite to the first surface 201, a plurality of conductive pads 203 exposed on the first surface 201, a plurality of mounting holes 209 extending through the first surface 201 and the second surface 202, a plurality of positioning holes 205 extending through the first surface 201 and the second surface 202, and a plurality of fastening holes 206 extending through the first surface 201 and the second surface 202. In one embodiment of the present disclosure, the circuit board 200 is a main circuit board on which a chip (not shown) and a plurality of electronic components (not shown) are disposed.

In the embodiment shown in the present disclosure, the plurality of conductive pads 203 include a first row of conductive pads 2031 and a second row of conductive pads 2032 arranged in sequence along a second direction A2-A2 (for example, a front-rear direction), wherein the first row of conductive pads 2031 and the second row of conductive pads 2032 are parallel to each other.

The mounting holes 209 are arranged in a row along a third direction A3-A3 and parallel to the first row of conductive pads 2031 and the second row of conductive pads 2032. The mounting holes 209 are located between the first row of conductive pads 2031 and the second row of conductive pads 2032 along the second direction A2-A2. The plurality of fastening holes 206 are located outside the plurality of conductive pads 203. In the illustrated embodiment of the present disclosure, the first direction A1-A1, the second direction A2-A2 and the third direction A3-A3 are perpendicular to one another.

Figure 29:
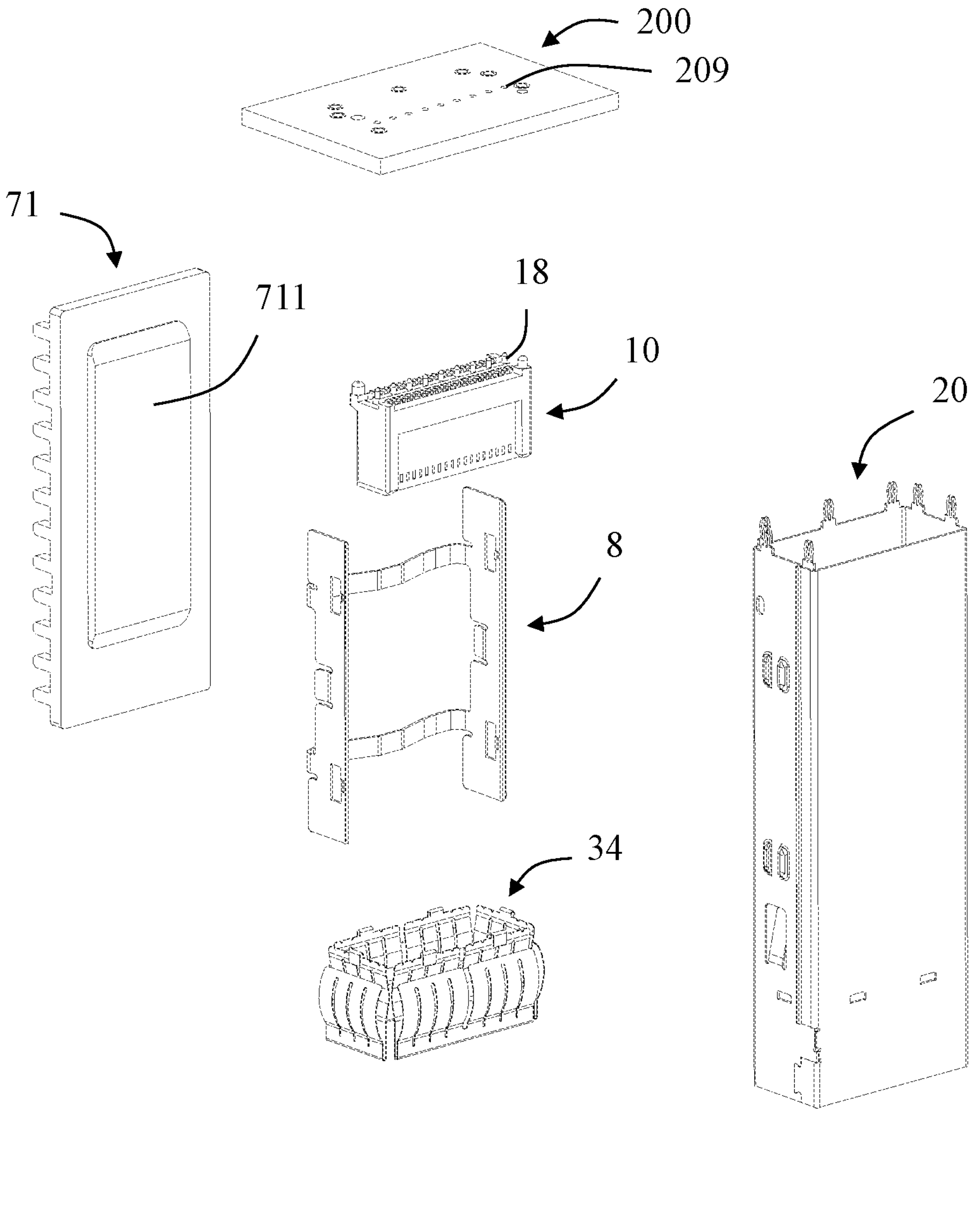
FIG. 29 is a further perspective exploded view of FIG. 26.
Figure 30:
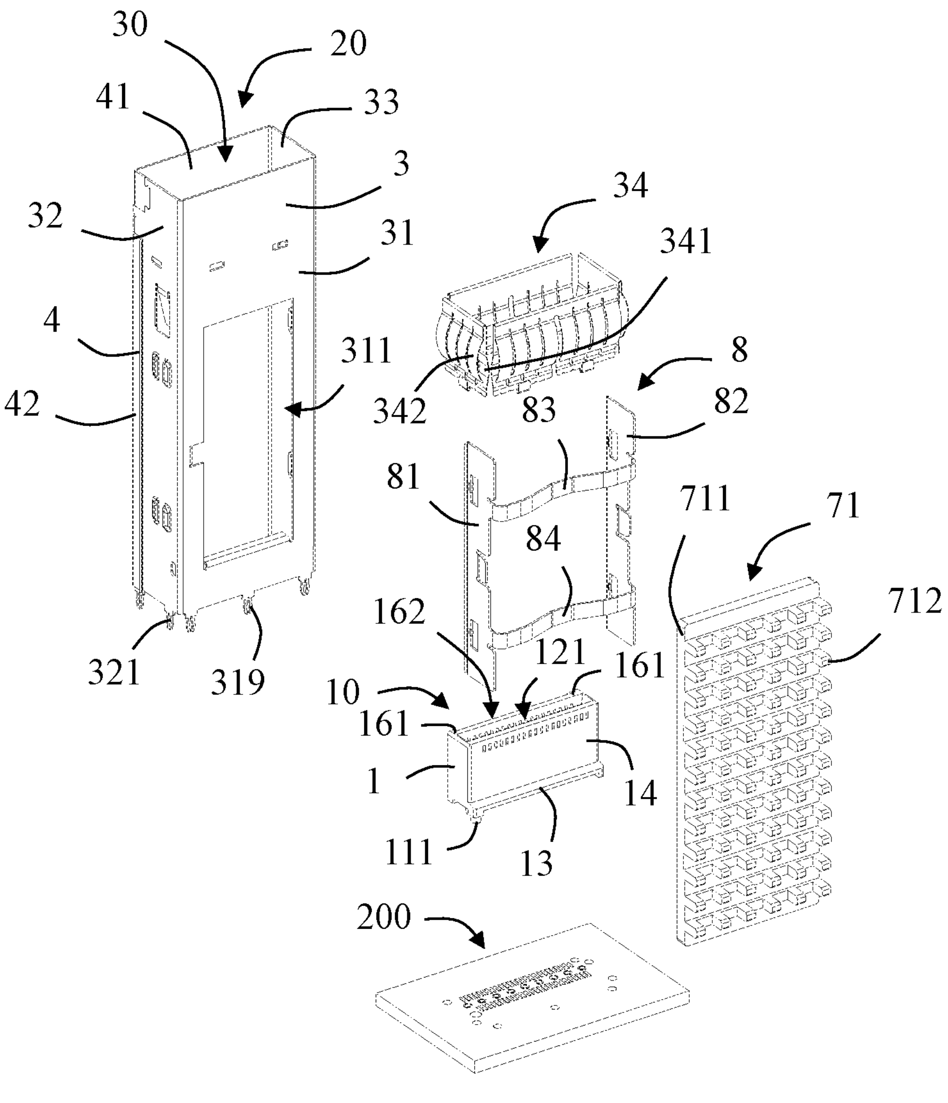
FIG. 30 is an exploded perspective view of FIG. 29 from another angle.
Figure 31:
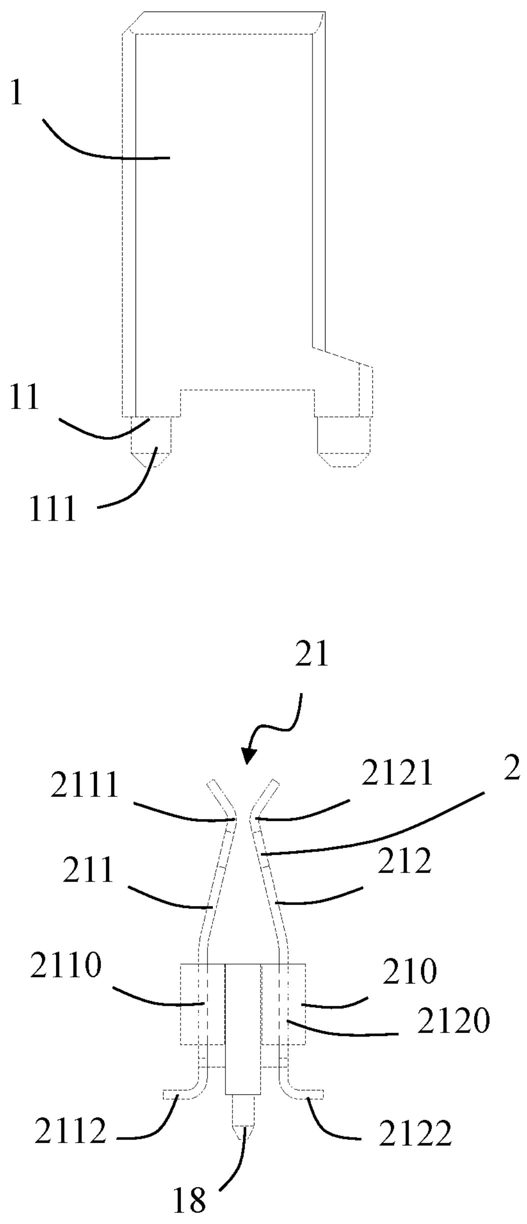
FIG. 31 is an exploded left side view of the electrical connector in FIG. 30.

Referring to FIG. 29 to FIG. 31, in the illustrated embodiment of the present disclosure, the electrical connector 10 includes an insulating body 1 and a plurality of conductive terminals 2. The insulating body 1 includes a mounting surface 11 configured to be mounted on the circuit board 200 and a first mating slot 121 opposite to the mounting surface 11. The insulating body 1 further includes a plurality of positioning posts 111 protruding downwardly beyond the mounting surface 11. The positioning posts 111 are configured to be inserted into corresponding positioning holes 205 to achieve positioning.

In the illustrated embodiment of the present disclosure, the insulating body 1 includes a base portion 13, and a first extension protrusion 14 extending from the base portion 13 and being perpendicular to the base portion 13. The insulating body 1 further includes two first protrusions 161 protruding outwardly from two ends of the first extension protrusion 14, and a first positioning slot 162 jointly formed by the first extension protrusion 14 and the two first protrusions 161. The first mating slot 121 extends upwardly through the first extension protrusion 14.

Referring to FIG. 31, in the illustrated embodiment of the present disclosure, the electrical connector 10 includes a first terminal module 21 assembled to the insulating body 1.

The first terminal module 21 includes a first insulating block 210, a plurality of first conductive terminals 211 fixed to the first insulating block 210, and a plurality of second conductive terminals 212 fixed to the first insulating block 210. In the illustrated embodiment of the present disclosure, the plurality of first conductive terminals 211 and the plurality of second conductive terminals 212 are insert-molded with the first insulating block 210. The first insulating block 210 is assembled and fixed to a bottom of the first mating slot 121. Of course, in other embodiments, there may be two first insulating blocks 210, which are respectively fixed to the plurality of first conductive terminals 211 and the plurality of second conductive terminals 212. The two first insulating blocks 210 may be provided with structures that cooperate with each other, so as to be directly or indirectly fixed together. In the illustrated embodiment of the present disclosure, the first insulating block 210 is provided with a row of mounting protrusions 18 protruding downwardly beyond the mounting surface 11. The mounting protrusions 18 are configured to be inserted into corresponding mounting holes 209.

Each first conductive terminal 211 includes a first fixing portion 2110, a first elastic contact arm 2111 extending from one end of the first fixing portion 2110, and a first tail portion 2112 bent from another end of the first fixing portion 2110. The first fixing portion 2110 is fixed to the first insulating block 210. The first tail portion 2112 extends beyond the first insulating block 210. In the illustrated embodiment of the present disclosure, the first tail portion 2112 is perpendicular to the first fixing portion 2110. In this way, a length of the first conductive terminal 211 can be shortened as much as possible, which is beneficial to improve the quality of signal transmission.

Each second conductive terminal 212 includes a second fixing portion 2120, a second elastic contact arm 2121 extending from one end of the second fixing portion 2120, and a second tail portion 2122 bent from another end of the second fixing portion 2120. The second fixing portion 2120 is fixed to the first insulating block 210. The second tail portion 2122 extends beyond the first insulating block 210. In the illustrated embodiment of the present disclosure, the second tail portion 2122 is perpendicular to the second fixing portion 2120. In this way, a length of the second conductive terminal 212 can be shortened as much as possible, which is beneficial to improve the quality of signal transmission.

In the illustrated embodiment of the present disclosure, the first elastic contact arm 2111 and the second elastic contact arm 2121 extend into the first mating slot 121. The first elastic contact arm 2111 and the second elastic contact arm 2121 are located on two sides of the first mating slot 121, respectively. The first elastic contact arm 2111 protrudes toward the second elastic contact arm 2121. The second elastic contact arm 2121 protrudes toward the first elastic contact arm 2111. In this way, the first elastic contact arm 2111 and the second elastic contact arm 2121 can jointly clamp the first tongue plate **401*b*1 of the first mating connector 401** to improve mating reliability.

The first tail portions 2112 are configured to be fixed to the first row of conductive pads 2031 by soldering or welding. The second tail portions 2122 are configured to be fixed to the second row of conductive pads 2032 by soldering or welding. In the illustrated embodiment of the present disclosure, the first tail portions 2112 are surface mounted to the first row of conductive pads 2031, and the second tail portions 2122 are surface mounted to the second row of conductive pads 2032.

The plurality of conductive terminals 2 include the plurality of first conductive terminals 211 and the plurality of second conductive terminals 212. The elastic contact arms include the first elastic contact arms 2111 and the second elastic contact arms 2121.

Of course, in other embodiments of the present disclosure, the plurality of first conductive terminals 211 and the plurality of second conductive terminals 212 may also be fixed to the insulating body 1 by assembling.

In the illustrated embodiment of the present disclosure, the metal shielding cage 20 includes a first metal shell 3, a second metal shell 4 buckled together with the first metal shell 3, a first heat sink 71, and a holding piece 8.

In one illustrated embodiment of the present disclosure, the first metal shell 3 is substantially U-shaped, which includes a first end wall 31, a first side wall 32 perpendicularly bent from one side of the first end wall 31, and a second side wall 33 perpendicularly bent from another side of the first end wall 31. The first side wall 32 is substantially parallel to the second side wall 33. The first end wall 31 defines a first opening 311.

In an embodiment of the present disclosure, referring to FIG. 7 and FIG. 8, the first buckling wall 42 perpendicularly bent from one side of the second end wall 41, and a second buckling wall 43 perpendicularly bent from another side of the second end wall 41. In the illustrated embodiment of the present disclosure, the second metal shell 4 and the first metal shell 3 have asymmetric structures.

Of course, in the embodiment of the present disclosure, as shown in FIG. 29 and FIG. 30, the first metal shell 3 and the second metal shell 4 can also be a one-piece structure, which is formed by stamping and fastening a piece of metal sheet.

In an embodiment of the present disclosure, the second end wall 41 is not in contact with the circuit board 200. Such arrangement is beneficial to the wiring of the circuit board 200 and reduces the risk of short circuit. Even, a gap between the second end wall 41 and the circuit board 200 can provide space for electronic components on the circuit board 200.

In another embodiment of the present disclosure, the second end wall 41 is in contact with the circuit board 200, for example, is in contact with a ground path on the circuit board 200. Such arrangement is beneficial to improve the grounding effect between the second end wall 41 and the circuit board 200.

In one embodiment of the present disclosure, when the first metal shell 3 and the second metal shell 4 are of two-piece structures, when assembly, the first buckling wall 42 is buckled and fixed on the first side wall 32; and the second buckling wall 43 is buckled and fixed on the second side wall 33. After assembly, the first end wall 31, the first side wall 32, the second side wall 33 and the second end wall 41 are jointly enclosed to form the receiving chamber 30. In the illustrated embodiment of the present disclosure, the metal shielding cage 20 is of an elevated vertical configuration. Specifically, the first end wall 31, the first side wall 32, the second side wall 33, and the second end wall 41 all have a same height H1 along the first direction A1-A1. Both the first side wall 32 and the second side wall 33 have a same first length L1 along the second direction A2-A2. Both the first end wall 31 and the second end wall 41 have a same first width W1 along the third direction A3-A3. In the illustrated embodiment of the present disclosure, the first height H1 is greater than the first length L1; the first height H1 is greater than the first width W1; and the first length L1 is greater than the first width W1. In the illustrated embodiment of the present disclosure, the first height H1 is greater than at least twice the first length L1, and the first height H1 is greater than at least twice the first width W1, that is H1>2*L1, and H1>2*W1.

The first metal shell 3 further includes a plurality of first fastening feet 321 protruding downwardly from a bottom edge of the first side wall 32 along the first direction A1-A1. Each first fastening foot 321 has a certain elastic deformation capability. The first fastening feet 321 are configured to be pressed into corresponding fastening holes 206 of the circuit board 200 so as to be electrically connected to the circuit board 200, for example, for grounding purpose.

The first metal shell 3 further includes a plurality of second fastening feet 331 protruding downwardly from a bottom edge of the second side wall 33 along the first direction A1-A1. Each second fastening foot 331 has a certain elastic deformation capability. The second fastening feet 331 are configured to be pressed into corresponding fastening holes 206 of the circuit board 200 so as to be electrically connected to the circuit board 200, for example, for grounding purpose.

In the illustrated embodiment of the present disclosure, the first end wall 31 is further provided with at least one third fastening foot 319 configured to fix the first end wall 31 to the circuit board 200. The third fastening foot 319 has a certain elastic deformation capability. The third fastening foot 319 is configured to be pressed into corresponding fastening hole 206 of the circuit board 200 so as to be electrically connected to the circuit board 200, for example, for grounding purpose. In the embodiment shown in the present disclosure, by providing the first fastening feet 321, the second fastening feet 331 and the third fastening foot 319, it is beneficial to fix the metal shielding cage 20 on the circuit board 200 more reliably.

In the embodiment shown in the present disclosure, in order to improve the grounding effect with the mating connector 400, the metal shielding cage 20 also includes a plurality of first ground elastic pieces 34 fixed to a top of the first end wall 31, the first side wall 32, the second side wall 33 and the second end wall 41. Each first ground elastic piece 34 includes a first elastic arm 341 protruding into the receiving chamber 30 and a second elastic arm 342 located outside the receiving chamber 30. Of course, in other embodiments, the first ground elastic pieces 34 of the metal shielding cage 20 may also be omitted.

In the illustrated embodiment of the present disclosure, the first heat sink 71 is fixed to the first end wall 31. In one embodiment of the present disclosure, the first heat sink 71 includes a first body portion 711 and a plurality of first heat dissipation fins 712 protruding sidewardly from the first body portion 711. In one embodiment of the present disclosure, the first body portion 711 is attached to the outer side of the first end wall 31. The plurality of first heat dissipation fins 712 protrude outwardly beyond the first end wall 31. The plurality of first heat dissipation fins 712 are equally spaced along the first direction A1-A1. The first body portion 711 at least partially extends inward into the first opening 311 and is exposed in the first receiving chamber 301. The first body portion 711 is configured to be in contact with the first main body portion **401*a*1 of the first mating connector 401 to achieve better heat dissipation for the first mating connector 401**.

The holding piece 8 includes a first side wall portion 81, a second side wall portion 82 opposite to the first side wall portion 81, a first abutting beam 83 connecting the first side wall portion 81 and the second side wall portion 82, and a second abutting beam 84 connecting the first side wall portion 81 and the second side wall portion 82. The first side wall portion 81 is fastened to the first side wall 32. The second side wall portion 82 is fastened to the second side wall 33. The first abutting beam 83 and the second abutting beam 84 are arranged at intervals along the first direction A1-A1. The first abutting beam 83 and the second abutting beam 84 abut against the first heat sink 71 to better fix the first heat sink 71. Of course, in other embodiments of the present disclosure, the first body portion 711 may also be fixed to the outside of the first end wall 31 by soldering or welding. In this condition, the holding piece 8 can also be omitted.

The above embodiments are only used to illustrate the present disclosure and not to limit the technical solutions described in the present disclosure. The understanding of this specification should be based on those skilled in the art. Descriptions of directions, although they have been described in detail in the above-mentioned embodiments of the present disclosure, those skilled in the art should understand that modifications or equivalent substitutions can still be made to the application, and all technical solutions and improvements that do not depart from the spirit and scope of the application should be covered by the claims of the application.

What is claimed is:

1. A connector assembly, comprising:

an electrical connector comprising an insulating body and a plurality of conductive terminals, the insulating body comprising a mating slot configured to receive a mating connector, the plurality of conductive terminals being configured to be mounted to a circuit board;

a metal shielding cage shielding a periphery of the electrical connector, the metal shielding cage comprising a receiving chamber communicating with the mating slot, the receiving chamber and the mating slot being configured to jointly receive the mating connector along a first direction, the first direction being perpendicular to the circuit board; and a heat dissipation element mounted to the metal shielding cage;

wherein the metal shielding cage comprises an inner metal shell, and the inner metal shell divides the receiving chamber into a first receiving chamber and a second receiving chamber located on two sides of the inner metal shell, respectively;

wherein the inner metal shell comprises a top wall, a first fixing wall bent downwardly from one side of the top wall, and a second fixing wall bent downwardly from another end of the top wall;

wherein the inner metal shell further comprises an opening surrounded by the top wall, the first fixing wall and the second fixing wall; the heat dissipation element further comprises a mounting block installed in the opening; and the mounting block is a metal block; and wherein the connector assembly further comprises a fastener, and the fastener passes through the circuit board and is fastened to the mounting block.

2. The connector assembly according to claim 1, wherein the metal shielding cage comprises a first end wall, a first side wall, a second side wall opposite to the first side wall, and a second end wall opposite to the first end wall; and wherein the receiving chamber is jointly enclosed by the first end wall, the first side wall, the second side wall and the second end wall.

3. The connector assembly according to claim 2, wherein the first end wall defines a first opening communicating with the receiving chamber;

the heat dissipation element comprises a first heat sink fixed to the first end wall; the first heat sink comprises a first base, a first body portion and a plurality of first heat dissipation fins protruding sidewardly from the first body portion; the first body portion at least partially extends into the first opening, and is exposed in the receiving chamber.

4. The connector assembly according to claim 3, wherein the second end wall defines a second opening communicating with the receiving chamber;

the heat dissipation element comprises a second heat sink fixed to the second end wall; the second heat sink comprises a second base, a second body portion and a plurality of second heat dissipation fins protruding sidewardly from the second body portion; the second body portion at least partially extends into the second opening, and is exposed in the receiving chamber.

5. The connector assembly according to claim 2, wherein the metal shielding cage has a first height H1 along the first direction; the metal shielding cage has a first length L1 along a second direction perpendicular to the first direction, where H1>L1.

6. The connector assembly according to claim 5, wherein the metal shielding cage has a first width W1 along a third direction which is perpendicular to the first direction and the second direction, where H1>W1.

7. The connector assembly according to claim 2, wherein the inner metal shell is fixed to the first side wall and the second side wall;

the mating connector comprises a first mating connector configured to be received in the first receiving chamber and a second mating connector configured to be received in the second receiving chamber.

8. The connector assembly according to claim 1, wherein the mounting block comprises a top wall portion, a bottom wall portion, a first wall portion, a second wall portion opposite to the first wall portion, a third wall portion connecting one end of the first wall portion and one end of the second wall portion, and a fourth wall portion connecting another end of the first wall portion and another end of the second wall portion; the first wall portion has a first wall surface; and the second wall portion has a second wall surface opposite to the first wall surface;

at a position adjacent to the bottom wall portion, the mounting block further comprises a heat dissipation through hole extending through the first wall surface and the second wall surface.

9. The connector assembly according to claim 8, wherein the first side wall defines a plurality of first heat dissipation holes, the second side wall defines a plurality of second heat dissipation holes, the heat dissipation through hole corresponds to heights of the first heat dissipation holes and the second heat dissipation holes in the first direction; and the first heat dissipation holes, the heat dissipation through hole and the second heat dissipation holes are in communication.

10. The connector assembly according to claim 8, wherein the mounting block further comprises a plurality of heat dissipation channels extending through the third wall portion and arranged at intervals; the plurality of heat dissipation channels extend upwardly through the top wall portion; and the plurality of heat dissipation channels are in communication with the heat dissipation through hole downwardly.

11. The connector assembly according to claim 1, further comprising a first terminal module; wherein the first terminal module comprises a first insulating block, a plurality of first conductive terminals fixed to the first insulating block, and a plurality of second conductive terminals fixed to the first insulating block; the plurality of conductive terminals comprise the plurality of first conductive terminals and the plurality of second conductive terminals;

each first conductive terminal comprises a first fixing portion, a first elastic contact arm extending from one end of the first fixing portion, and a first tail portion extending from another end of the first fixing portion; the first fixing portion is fixed to the first insulating block; the first tail portion extends beyond the first insulating block;

each second conductive terminal comprises a second fixing portion, a second elastic contact arm extending from one end of the second fixing portion, and a second tail portion extending from another end of the second fixing portion; the second fixing portion is fixed to the first insulating block; the second tail portion extends beyond the first insulating block; and the first tail portion and the second tail portion are configured to be mounted on the circuit board.

12. The connector assembly according to claim 1, wherein the insulating body comprises a base portion, a first extension protrusion extending from one side of the base portion along the first direction, and a second extension protrusion extending from another side of the base portion along the first direction; the first extension protrusion and the second extension protrusion are located on a same side of the base portion;

the insulating body comprises two first protrusions protruding from two ends of the first extension protrusion toward the second extension protrusion, and a first positioning slot jointly formed by the first extension protrusion and the two first protrusions;

the insulating body comprises two second protrusions protruding from two ends of the second extension protrusion toward the first extension protrusion, and a second positioning slot jointly formed by the second extension protrusion and the two second protrusions;

the insulating body comprises a receiving groove located between the first extension protrusion and the second extension protrusion; the receiving groove is located between the first positioning slot and the second positioning slot; the receiving groove is in communication with the first positioning slot and the second positioning slot;

the mating slot comprises a first mating slot formed on the first extension protrusion and extending through the first extension protrusion along the first direction, and a second mating slot formed on the second extension protrusion and extending through the second extension protrusion along the first direction; the first mating slot is in communication with the first receiving chamber so as to receive the first mating connector; the second mating slot is in communication with the second receiving chamber so as to receive the second mating connector.

13. A connector assembly, comprising:

an electrical connector comprising an insulating body and a plurality of conductive terminals; the insulating body comprising a first mating slot and a second mating slot; the plurality of conductive terminals being configured to be mounted to a circuit board;

a metal shielding cage shielding a periphery of the electrical connector; the metal shielding cage comprising a first end wall, a first side wall, a second side wall opposite to the first side wall, a second end wall opposite to the first end wall, and an inner metal shell; the first end wall, the first side wall, the second side wall and the second end wall being jointly enclosed to form a receiving chamber; the inner metal shell divides the receiving chamber into a first receiving chamber and a second receiving chamber located on two sides of the inner metal shell, respectively; the first receiving chamber and the first mating slot being in communication and configured to receive a first mating connector along a first direction; the second receiving chamber and the second mating slot being in communication and configured to accommodate a second mating connector along the first direction; and a heat dissipation element comprising a mounting block mounted in the inner metal shell, the mounting block being a metal block;

the connector assembly further comprises a fastener, and the fastener passes through the circuit board and is fastened to the mounting block.

14. The connector assembly according to claim 13, wherein the insulating body defines a through hole; the mounting block is provided with a mounting post; the mounting post is provided with an internal threaded hole; the mounting post is inserted into the through hole; the fastener is a bolt and fastened in the internal threaded hole of the mounting post.

15. The connector assembly according to claim 13, wherein the first end wall defines a first opening communicating with the first receiving chamber; the second end wall defines a second opening communicating with the second receiving chamber;

the heat dissipation element comprises a first heat sink fixed to the first end wall; the first heat sink comprises a first base, a first body portion and a plurality of first heat dissipation fins protruding sidewardly from the first body portion; the first body portion at least partially extends into the first opening, and is exposed in the receiving chamber; the first base comprises a first internal threaded hole;

the heat dissipation element further comprises a second heat sink fixed to the second end wall; the second heat sink comprises a second base, a second body portion and a plurality of second heat dissipation fins protruding sidewardly from the second body portion; the second body portion at least partially extends into the second opening, and is exposed in the receiving chamber; the second base comprises a second internal threaded hole;

the connector assembly comprises a first fastening member fastened in the first internal threaded hole and a second fastening member fastened in the second internal threaded hole.

16. A connector assembly, comprising:

an electrical connector comprising an insulating body and a plurality of conductive terminals; the insulating body comprising a first mating slot and a second mating slot; the plurality of conductive terminals being configured to be mounted to a circuit board;

a metal shielding cage shielding a periphery of the electrical connector; the metal shielding cage comprising a first end wall, a first side wall, a second side wall opposite to the first side wall, a second end wall opposite to the first end wall, and an inner metal shell; the first end wall, the first side wall, the second side wall and the second end wall being jointly enclosed to form a receiving chamber; the inner metal shell divides the receiving chamber into a first receiving chamber and a second receiving chamber located on two sides of the inner metal shell, respectively; the first receiving chamber and the first mating slot being in communication and configured to receive a first mating connector along a first direction; the second receiving chamber and the second mating slot being in communication and configured to accommodate a second mating connector along the first direction; and a heat dissipation element comprising a mounting block mounted in the inner metal shell, the mounting block being a metal block;

wherein the mounting block comprises a top wall portion, a bottom wall portion, a first wall portion, a second wall portion opposite to the first wall portion, a third wall portion connecting one end of the first wall portion and one end of the second wall portion, and a fourth wall portion connecting another end of the first wall portion and another end of the second wall portion; the first wall portion has a first wall surface; and the second wall portion has a second wall surface opposite to the first wall surface;

at a position adjacent to the bottom wall portion, the mounting block further comprises a heat dissipation through hole extending through the first wall surface and the second wall surface;

the mounting block further comprises a plurality of heat dissipation channels extending through the third wall portion and arranged at intervals; the plurality of heat dissipation channels extend upwardly through the top wall portion; and the plurality of heat dissipation channels are in communication with the heat dissipation through hole downwardly.

17. The connector assembly according to claim 16, further comprising a fastener;

wherein the fastener passes through the circuit board and is fastened to the mounting block.

18. The connector assembly according to claim 17, wherein the insulating body defines a through hole; the mounting block is provided with a mounting post; the mounting post is provided with an internal threaded hole; the mounting post is inserted into the through hole; the fastener is a bolt and fastened in the internal threaded hole of the mounting post.

19. The connector assembly according to claim 16, wherein the first end wall defines a first opening communicating with the first receiving chamber and a second opening communicating with the second receiving chamber;

the heat dissipation element comprises a first heat sink fixed to the first end wall and a second heat sink fixed to the second end wall;

the first heat sink comprises a first base, a first body portion and a plurality of first heat dissipation fins protruding sidewardly from the first body portion; the first body portion at least partially extends into the first opening, and is exposed in the first receiving chamber; and the second heat sink comprises a second base, a second body portion and a plurality of second heat dissipation fins protruding sidewardly from the second body portion; the second body portion at least partially extends into the second opening, and is exposed in the second receiving chamber.

20. The connector assembly according to claim 19, wherein the first base defines a first internal threaded hole, the second base defines a second internal threaded hole, and the connector assembly further comprises a first fastening member fastened in the first internal threaded hole and a second fastening member fastened in the second internal threaded hole.

* * * * *